(12) United States Patent
Oh et al.

(10) Patent No.: US 12,002,744 B2
(45) Date of Patent: Jun. 4, 2024

(54) FILM PACKAGE AND DISPLAY DEVICE INCLUDING FILM PACKAGE

(71) Applicant: SAMSUNG DISPLAY CO., LTD., Yongin-si (KR)

(72) Inventors: Myong-Soo Oh, Asan-si (KR); Minsung Kim, Suwon-si (KR); Juno Song, Jeollabuk-do (KR); Heejong Shin, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 104 days.

(21) Appl. No.: 17/356,899

(22) Filed: Jun. 24, 2021

(65) Prior Publication Data
US 2022/0068786 A1 Mar. 3, 2022

(30) Foreign Application Priority Data
Aug. 25, 2020 (KR) .................. 10-2020-0107236

(51) Int. Cl.
| | |
|---|---|
| *H01L 25/18* | (2023.01) |
| *G09G 3/3241* | (2016.01) |
| *H01L 21/48* | (2006.01) |
| *H01L 21/66* | (2006.01) |
| *H01L 23/498* | (2006.01) |
| *H01L 23/544* | (2006.01) |
| *H10K 59/131* | (2023.01) |

(52) U.S. Cl.
CPC ..... *H01L 23/49838* (2013.01); *G09G 3/3241* (2013.01); *H01L 21/4803* (2013.01); *H01L 22/20* (2013.01); *H01L 23/4985* (2013.01); *H01L 23/544* (2013.01); *G09G 2310/0243* (2013.01); *G09G 2330/02* (2013.01); *H01L 25/18* (2013.01); *H10K 59/131* (2023.02)

(58) Field of Classification Search
CPC .. G06F 3/0412; G06F 3/0446; G06F 3/04164; G09G 2300/0426; G09G 2320/0233; G09G 3/3241; G09G 2330/02; H01L 23/49838; H01L 21/4803; H01L 22/20; H01L 23/4985; H01L 23/544; H01L 25/18; H10K 59/131
See application file for complete search history.

(56) References Cited

U.S. PATENT DOCUMENTS

| | | | | |
|---|---|---|---|---|
| 2013/0292705 | A1* | 11/2013 | Makimura | H01L 31/035272 257/81 |
| 2019/0073440 | A1* | 3/2019 | Farbiz | H01L 29/785 |
| 2020/0098795 | A1* | 3/2020 | Jung | H01L 23/528 |
| 2020/0366281 | A1* | 11/2020 | Iwata | H03K 17/0828 |

FOREIGN PATENT DOCUMENTS

KR 10-2016-0124325 10/2016

* cited by examiner

*Primary Examiner* — Michael A Faragalla
(74) *Attorney, Agent, or Firm* — F. Chau & Associates, LLC

(57) ABSTRACT

A film package includes a base substrate having a bottom surface that includes a first portion and a second portion that are spaced apart from each other. First pad wires are disposed on the first portion of the bottom surface of the base substrate. Second pad wires are disposed on the second portion of the bottom surface of the base substrate. A light blocking member is disposed between the first pad wires and the second pad wires.

18 Claims, 13 Drawing Sheets

FILM PACKAGE AND DISPLAY DEVICE INCLUDING FILM PACKAGE

CROSS-REFERENCE RELATED APPLICATION

This application claims priority under 35 U.S.C. § 119 to Korean Patent Application No. 10-2020-0107236, filed on Aug. 25, 2020 in the Korean Intellectual Property Office, the disclosure of which is incorporated by reference in its entirety herein.

TECHNICAL FIELD

Embodiments of the present inventive concepts relate generally to a film package and a display device including a film package, More particularly, embodiments of the present inventive concept relate to a film package including a pad wire and a display device including film package including a pad wire.

DISCUSSION OF RELATED ART

Flat panel display devices are a type of display device that has become increasingly popular over cathode ray tube display devices due its relatively lightweight and thin characteristics. Representative examples of flat panel display devices include a liquid crystal display device and an organic light emitting diode display device.

The display device may include a display area and a pad area. Display structures, such as an anode electrode, a light emitting layer, a cathode electrode and the like, and semiconductor elements may be disposed in the display area. Pad electrodes may be disposed in the pad area. An external device may generate gate signals, data signals, power supply voltages, and the like. These gate signals, data signals, and power supply voltages may be provided to the display structures and the semiconductor elements through the pad electrodes. A film package may be disposed on the pad electrodes to electrically connect the external device to the pad electrodes. The film package may include a base substrate, a driver IC chip, pad wires, and the like.

SUMMARY

Some embodiments provide a film package including a pad wire.

Some embodiments provide a display device including film package including a pad wire.

According to an embodiment of the present inventive concepts, a film package includes a base substrate having a bottom surface that includes a first portion and a second portion that are spaced apart from each other. First pad wires are disposed on the first portion of the bottom surface of the base substrate. Second pad wires are disposed on the second portion of the bottom surface of the base substrate. A light blocking member is disposed between the first pad wires and the second pad wires.

In embodiments, the light blocking member may be spaced apart from the first pad wires and the second pad wires on the bottom surface of the base substrate.

In embodiments, the film package may further include first dummy patterns at d second dummy patterns. The first dummy patterns may be spaced apart from a first side of the light blocking member between the first pad wires and the second pad wires on the bottom surface of the base substrate. The second dummy patterns may be spaced apart from a second side of the light blocking member between the first pad wires and the second pad wires on the bottom surface of the base substrate.

In embodiments, the film package may further include third pad wires and fourth pad wires. The third pad wires may be disposed between the light blocking member and the first pad wires on the bottom surface of the base substrate, and may have a first bent part along a profile of an outer periphery of the light blocking member at a portion where the light blocking member is located. The fourth pad wires may be disposed between the light blocking member and the second pad wires on the bottom surface of the base substrate, and may have a second bent part along a profile of an outer periphery of the light blocking member at a portion where the light blocking member is located.

In embodiments, external light may not be transmitted through a portion of the base substrate in which the first and second pad wires and the light blocking member are disposed, and the external light may be transmitted through a portion of the base substrate in which the first and second pad wires and the light blocking member are not disposed.

According to an embodiment of the present inventive concepts, a display device includes a substrate having a display area, a first pad area disposed on a first side of the display area, and a second pad area disposed on a second side of the display area. Display structures are disposed on the substrate in the display area. First pad electrodes are disposed on the substrate in the first pad area. Second pad electrodes are disposed on the substrate in the second pad area. A first film package is electrically connected to the first pad electrode. The first film package includes a first base substrate having a bottom surface that includes a first portion and a second portion that are spaced apart from each other. First pad wires are disposed on the first portion of the bottom surface of the first base substrate. Second pad wires are disposed on the second portion of the bottom surface of the first base substrate. A light blocking member is disposed between the first pad wires and the second pad wires.

In embodiments, the first film package may not include a driver IC chip.

In embodiments, a power supply voltage generated by an external device may be provided to the first pad electrodes through the first film package, and the power supply voltage may be provided to the display structure.

In embodiments, the power supply voltage may include a low power supply voltage having a first power level and a high power supply voltage having a second power level that is higher than the first power level.

In embodiments, the display device r lay further include first semiconductor elements. The first semiconductor elements may be disposed between the substrate and the display structure, and may be electrically connected to the display structures.

In embodiments, the high power supply voltage may be provided in a direction from the first pad area to the second pad area, and may be sequentially provided in the direction to the first semiconductor elements disposed in the display area.

In embodiments, the display device may further include a second film package electrically connected to the second pad electrode, The second film package may include a second base substrate, pad wires disposed on a bottom surface of the second base substrate, and a driver IC chip electrically connected to the pad wires.

In embodiments, the display device may further include second semiconductor elements. The second semiconductor elements may be disposed between the substrate and the display structure, and may be electrically connected to the display structures.

In embodiments, a driving signal generated by an external device may be provided to the second pad electrodes through the second film package, and the driving signal may be provided to the second semiconductor element.

In embodiments, the driving signal may include a data signal.

In embodiments, the driving signal may be provided in a direction from the second pad area to the first pad area, and may be sequentially provided in the direction to the second semiconductor elements disposed in the display area.

In embodiments, the light blocking member may be spaced apart from the first pad wires and the second pad wires.

In embodiments, the display device may further include first dummy patterns and second dummy patterns. The first dummy patterns may be spaced apart from a first side of the light blocking member between the first pad wires and the second pad wires, and the second dummy patterns may be spaced apart from a second side of the light blocking member between the first pad wires and the second pad wires.

In embodiments, the display may further include third pad wires and fourth pad wires. The third pad wires may be disposed between the light blocking member and the first pad wires, and may have a first bent part along a profile of an outer periphery of the light blocking member at a portion where the light blocking member is located. The fourth pad wires may be disposed between the light blocking member and the second pad wires, and may have a second bent part along a profile of an outer periphery of the light blocking member at a portion where the light blocking member is located.

In embodiments, external light may not be transmitted through a portion of the base substrate in which the first and second pad wires and the light blocking member are disposed, and the external light may be transmitted through a portion of the base substrate in which the first and second pad wires and the light blocking member are not disposed.

According to an embodiment of the present inventive concepts, a film package includes a base substrate having pad wires disposed thereon. A light blocking member is disposed between the pad wires and is spaced apart from the pad wires. The light blocking member is configured to provide a difference in light transmittance through the base substrate to detect a defect in the base substrate.

Since the film package according to embodiments of the present inventive concepts includes the light blocking member, the difference in transmittance may be generated, so that a defect of the film package may be accurately inspected. In addition, since the light blocking member functions as a reference point in a process of cutting the film package, the film package may be easily cut.

In the method of manufacturing the film package according to an embodiment of the present inventive concept, the light blocking member is formed on the preliminary base substrate so that it may be accurately determined whether the preliminary base substrate has a defect due to the difference in light transmittance, and the light blocking member functions as a reference point so that the preliminary base substrate may be accurately cut.

Since the display device according to an embodiment of the present inventive concepts includes the first film package including the light blocking member, defects of the first film package may be reduced. Accordingly, defects of the display device caused by the defects of the first film package may also be reduced, so that a defect rate of the display device may be reduced.

BRIEF DESCRIPTION OF THE DRAWINGS

Embodiments can be understood in more detail from the following description taken in conjunction with the accompanying drawings, in which.

DETAILED DESCRIPTION OF EMBODIMENTS

Figure 1:
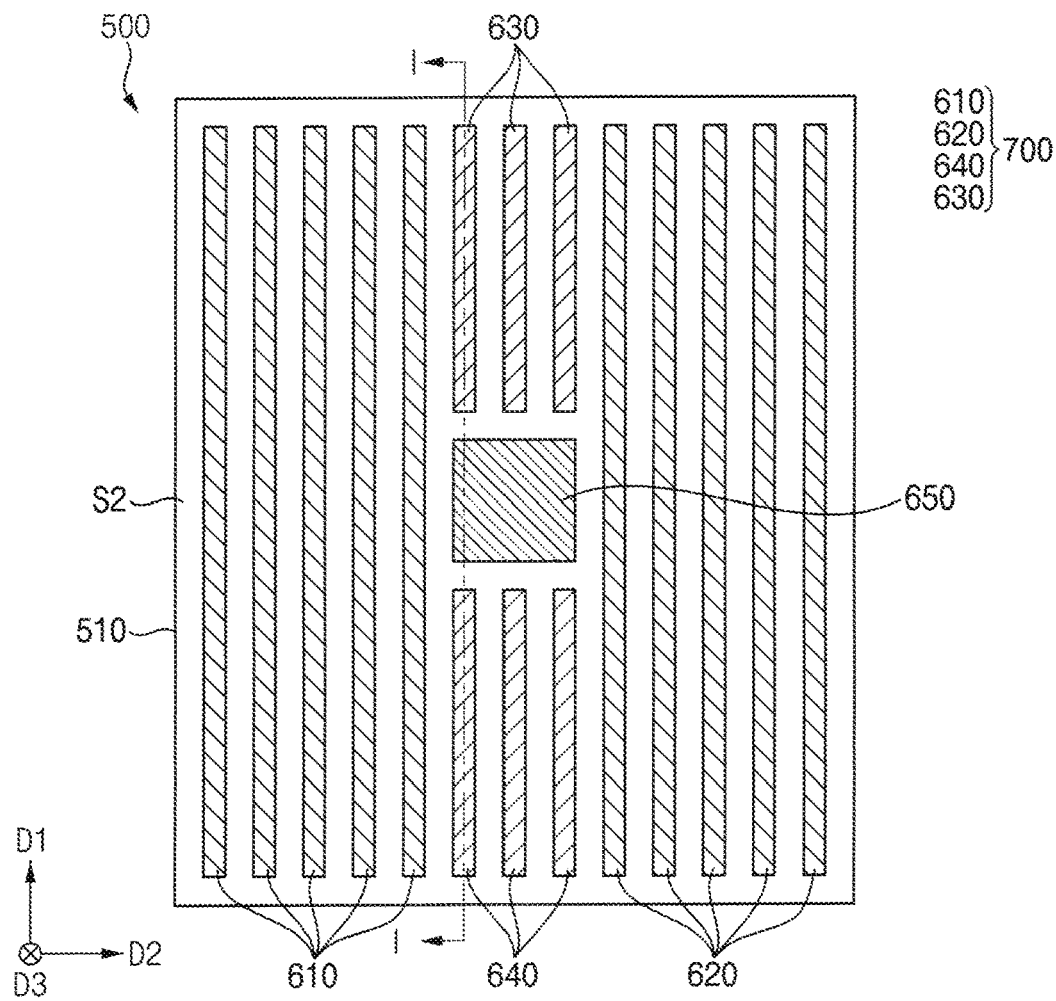
FIG. 1 is a plan view showing a film package according to an embodiment of the present inventive concepts.

Hereinafter, film packages, a method for manufacturing a film package, and a display device according to embodiments of the present inventive concepts will be described in detail with reference to the accompanying drawing. In the accompanying, drawings, same or similar reference numerals refer to the same or similar elements.

Figure 2:
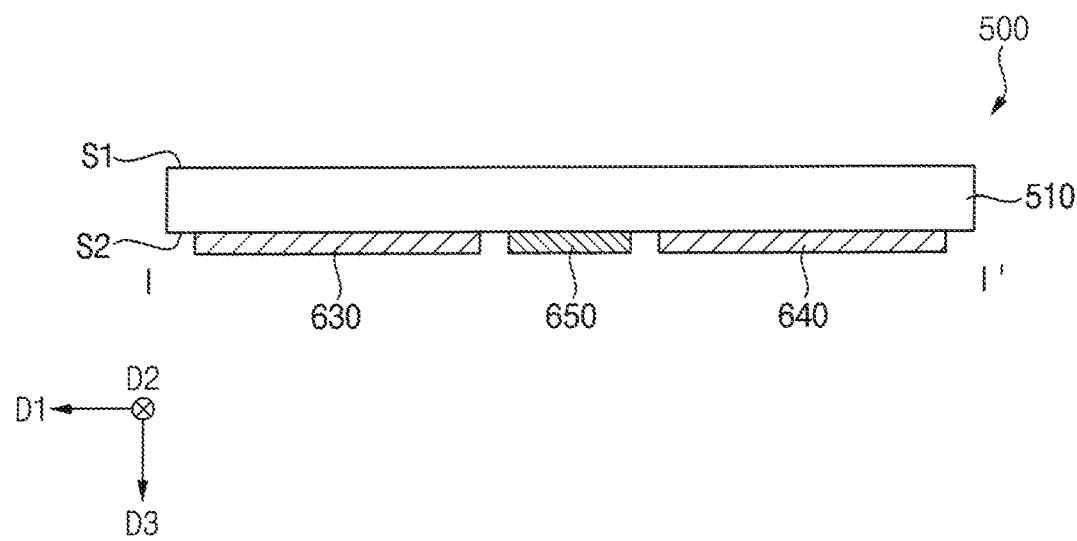
FIG. 2 is a cross-sectional view taken along line I-I' of FIG. 1 according to an embodiment of the present inventive concepts.

FIG. 1 is a plan view showing a film package according to embodiments of the present inventive concepts, and FIG. 2 is a cross-sectional view taken along line I-I' of FIG. 1.

Referring to FIGS. 1 and 2, a film package 500 may include a base substrate 510, pad wires 700, a light blocking, member 650, and the like. In an embodiment, the pad wires 700 may include first pad wires 610, second pad wires 620, first dummy patterns 630, and second dummy patterns 640. In addition, as shown in, the embodiment of FIG. 2, the base substrate 510 may include a first surface S1 and a second surface S2. For example, the first surface S1 may be an upper surface (e.g., a top surface) and the second surface S2 may be a lower surface (e.g., a bottom surface) that is spaced apart from the first surface S1 in the third direction D3.

The film package 500 may include the base substrate 510. In an embodiment, the base substrate 510 may include a flexible film including a material having flexibility. In addition, the base substrate 510 may be transparent to allow external light to be transmuted therethrough. For example, in an embodiment, the base substrate 510 may include a polyimide resin, a polyester resin, polyethylene terephthalate (PET) and the like. However, embodiments of the present inventive concepts are not limited thereto.

The first pad wires 610 may be disposed on a first portion of the second surface S2 of the base substrate 510. Each of the first pad wires 610 may extend longitudinally in a first direction D1 that is parallel to the second surface S2 of the base substrate 510, and the first pad wires 610 may be spaced apart from each other in a second direction D2 that is orthogonal to the first direction D1 and is also parallel to the second surface S2 of the base substrate 510. In an embodiment, when the film package 500 is electrically connected to a display device, a power supply voltage for driving the display device may be provided through the first pad wires 610, In an embodiment, the first pad wires 610 may include at least one material selected from metal, an alloy, metal nitride, conductive metal oxide, a transparent conductive material, and the like. In some embodiments, the first pad wires 610 may include a metal, an alloy, metal nitride, conductive metal oxide, and the like, which are opaque, so that the external light may not be transmitted through the first pad wires 610. In other embodiments, the first pad wires 610 may have a multilayer structure including a plurality of metal layers. For example, the metal layers may have mutually different thicknesses, or may include mutually different materials.

The second pad wires 620 may be disposed on a second portion of the second surface S2 of the base substrate 510 that is different from the first portion of the second surface S2 of the base substrate 510. For example, as shown in the embodiment of FIG. 2, the second portion the second surface S2 of the base substrate 510 may be spaced apart from the first portion of the second surface S2 of the base substrate 510 in the second direction D2. Each of the second pad wires 620 may extend longitudinally in the first direction D1, and the second pad wires 620 may be spaced apart from each other in the second direction D2. For example, the second pad wires 620 may be spaced apart from the first pad wires 610 in the second direction D2, and the first pad wires 610 and the second pad wires 620 may extend parallel to each other. In an embodiment, when the film package 500 is electrically connected to the display device, the power supply voltage for driving the display device may be provided through the second pad wires 620. In an embodiment, the second pad wires 620 may include at least one material selected from metal, an alloy, metal nitride, conductive metal oxide, a transparent conductive material, and the like. In some embodiments, the second pad wires 620 may include a metal, an alloy, metal nitride, conductive metal oxide, and the like, which are opaque, so that the external light may not be transmitted through the second pad wires 620. In other embodiments, the second pad wires 620 may have a multilayer structure including a plurality of metal layers. For example, the metal layers may have mutually different thicknesses, or may include mutually different materials.

The first dummy patterns 630 may be disposed adjacent to a first side of the light blocking member 650 (e.g., an upper side of the light blocking member 650 in the first direction D1) between the first and second pad wires 610 and 620 on the second surface S2 of the base substrate 510 (e.g., in the second direction D2). The first dummy patterns 630 may be spaced apart from the first side of the light blocking member 650 in the first direction D1). The first dummy patterns 630 may extend longitudinally in the first direction D1, and may be spaced apart from each other in the second direction D2. For example, the first dummy patterns 630 may be spaced apart from the first and second pad wires 610 and 620 (e.g., in the second direction D2), and the first dummy patterns 630 may extend parallel to the first and second pad wires 610 and 620. In an embodiment, when the film package 500 is electrically connected to the display device, the power supply voltage fbr driving the display device may not be provided to the first dummy patterns 630. In an embodiment, the first dummy patterns 630 may include at least one material selected from a metal, an alloy, metal nitride, conductive metal oxide, a transparent conductive material, and the like. In some embodiments, the first dummy patterns 630 may include a metal, an alloy, metal nitride, conductive metal oxide, and the like, which are opaque, so that the external light may not be transmitted through the first dummy patterns 630. In other embodiments, the first dummy patterns 630 may have a multilayer structure including a plurality of metal layers. For example, the metal layers may have mutually afferent thicknesses, or may include mutually different materials.

The second dummy patterns 640 may be disposed adjacent to a second side of the light blocking member 650 (e.g., a lower side of the light blocking member 650 in the first direction D1) between the first and second pad wires 610 and 620 (e.g., in the second direction D2) on the second surface S2 of the base substrate 510. The second dummy patterns 640 may be spaced apart from the second side of the light blocking member 650 (e.g., in the first direction D1). The second dummy patterns 640 may extend longitudinally in the first direction D1, and may be spaced apart from each other in the second direction D2. For example, the second dummy patterns 640 may be spaced apart from the first and second pad wires 610 and 620 (e g., in the second direction D2), and the second dummy patterns 640 may extend parallel to the first and second pad wires 610 and 620. In an embodiment, when the film package 500 is electrically connected to the display device, the power supply voltage for driving the display device may not be provided to the second dummy patterns 640. In an embodiment, the second dummy patterns 640 may include at least one material selected from metal, an alloy, metal nitride, conductive metal oxide, a transparent conductive material, and the like. In some embodiments, the second dummy patterns 640 may include a metal, an alloy, metal nitride, conductive metal oxide, and the like, which are opaque, so that the external light may not be transmitted through the second dummy patterns 640. In other embodiments, the second dummy patterns 640 may have a multilayer structure including a plurality of metal layers. For example, the metal layers may have mutually different thicknesses, or may include mutually different materials.

The light blocking member 650 may be disposed between the first pad wires 610 and the second pad wires 520 (e.g., in the first direction D1) on the second surface S2 of the base substrate 510. For example, as shown in the embodiment, of FIG. 1, the light blocking member 650 may be located on a central portion of the second surface S2 of the base substrate 510 (e.g., a central portion in the first and second directions D1, D2). However, embodiments of the present inventive concepts are not limited thereto and in some embodiments, the light blocking member 650 may be disposed on the first surface S1 of the base substrate 510. For example, a lower surface of the light blocking member 650 may directly contact the first surface S1 of the base substrate 510. In an embodiment, the light blocking member 650 may be spaced apart from the first and second pad wires 610 and 520 (e.g., in the first direction D1). For example, the light blocking member 650 may be disposed on the second surface S2 of the base substrate and may be spaced apart from the first and second pad wires 610, 620. In addition, as shown in the embodiment of FIG. 1, the light blocking member 654) may have a square shape when viewed in a plan view. However, embodiments of the present inventive concepts are not limited thereto. In an embodiment in which the flint package 500 is electrically connected to the display device, the power supply voltage for driving the display device may not be provided to the light blocking member 650. In an embodiment the light blocking member 650 may include at least one material selected from a metal, an alloy, metal nitride, conductive metal oxide, and the like, which are opaque, so that the external light may not be transmitted through the light blocking member 650. For example, the light blocking member 650 may include at least one compound selected from gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (1r), an aluminum-containing alloy, aluminum nitride ($AlN_x$), a silver-containing alloy, tungsten nitride ($WN_x$), a copper-containing alloy, a molybdenum-containing ahoy, titanium nitride ($TN_x$), chromium nitride ($CrN_x$), tantalum nitride ($TaN_x$), strontium ruthenium oxide ($SrRu_xO_y$), and the like. In other embodiments, the light blocking member 650 may have a multilayer structure including a plurality of metal layers. For example, the metal layers may have mutually different thicknesses, or may include mutually different materials.

In an embodiment, the first pad wires 610, the second pad wires 620, the first dummy patterns 630, the second dummy patterns 640, and the light blocking member 650 may include the same material, and may be simultaneously formed. For example, the first pad wires 610, the second pad wires 620, the first dummy patterns 630, the second dummy patterns 640, and the light blocking member 650 may each be formed h forming a preliminary electrode layer over the whole base substrate 510, and partially etching the preliminary electrode layer.

However, although the light blocking member 650 is shown in the embodiment of FIG. 1 as being located on die central portion of the second surface S2 of the base substrate 510, embodiments of the present inventive concepts are not limited thereto. For example, the light blocking member 650 may be disposed on various other portions of the base substrate 510 other than the central portion of the second surface S2 of the base substrate 510.

The film package 500 may include the base substrate 510, the pad wires 700, and the light blocking member 650. In other embodiments, a solder resist (e.g., a silicon compound, metal oxide, etc) may be formed on the base substrate 510 to cover the pad wires 700 and the light blocking member 650. In this embodiment, the solder resist may protect the pad wires 700 and the light blocking member 650, and may not be formed in a portion electrically connected to pad electrodes.

For example, in a conventional film package, only pad wires may be formed. In a process of inspecting a defect of the conventional film package, when light emitted from an inspection device is transmitted through the conventional film package, there may be no difference in light transmittance. For example, a difference in light transmittance may occur in a film package including a driver IC chip because the driver IC chip blocks the light, whereas the difference in light transmittance may not occur in the film package including only the pad wires because the film package including only the pad wires does not include the driver IC chip. Therefore, the defect of the conventional film package may not be accurately inspected. In addition, in a process of cutting the conventional film package, a reference point does not exist and a defect may be generated during the cutting. For example, the driver IC chip may function as a reference point in the film package including the driver IC chip so that the cutting may be accurately performed, whereas a reference point does not exist in the film package including only the pad wires because the film package including only the pad wires does not include the driver IC chip and a defect may be generated during the cutting.

Since the film package 500 according to embodiments of the present inventive concepts includes the light blocking member 650, the difference in light transmittance may be generated so that a defect of the film package 500 may be accurately inspected. For example, the film package 500 may block external light from being transmitted through a partial portion of the base substrate 510 in which the pad wires 700 and the light blocking member 650 are disposed and the film package 500 may transmit external light through a partial portion of the base substrate 510 in which the pad wires 700 and the light blocking member 650 are not disposed, such as the portions of the base substrate 510 between the light bloc king member 650 and the pad wires 700. In addition, since the light blocking member 650 functions as a reference point in a process of cutting the film package 500, the film package 500 may be accurately cut.

Figure 3:
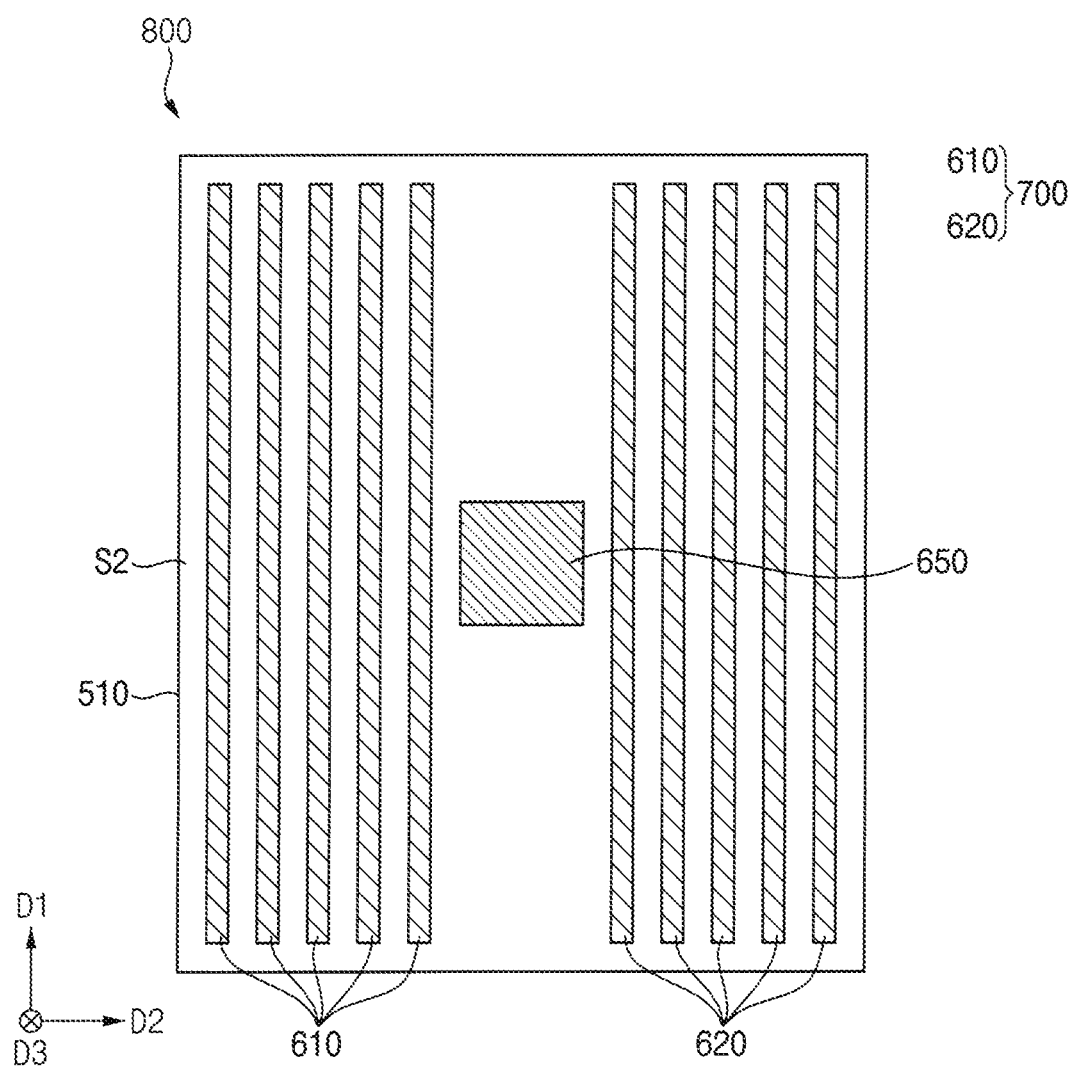
FIG. 3 is a plan view showing a film package according to an embodiment of the present inventive concepts.
Figure 4:
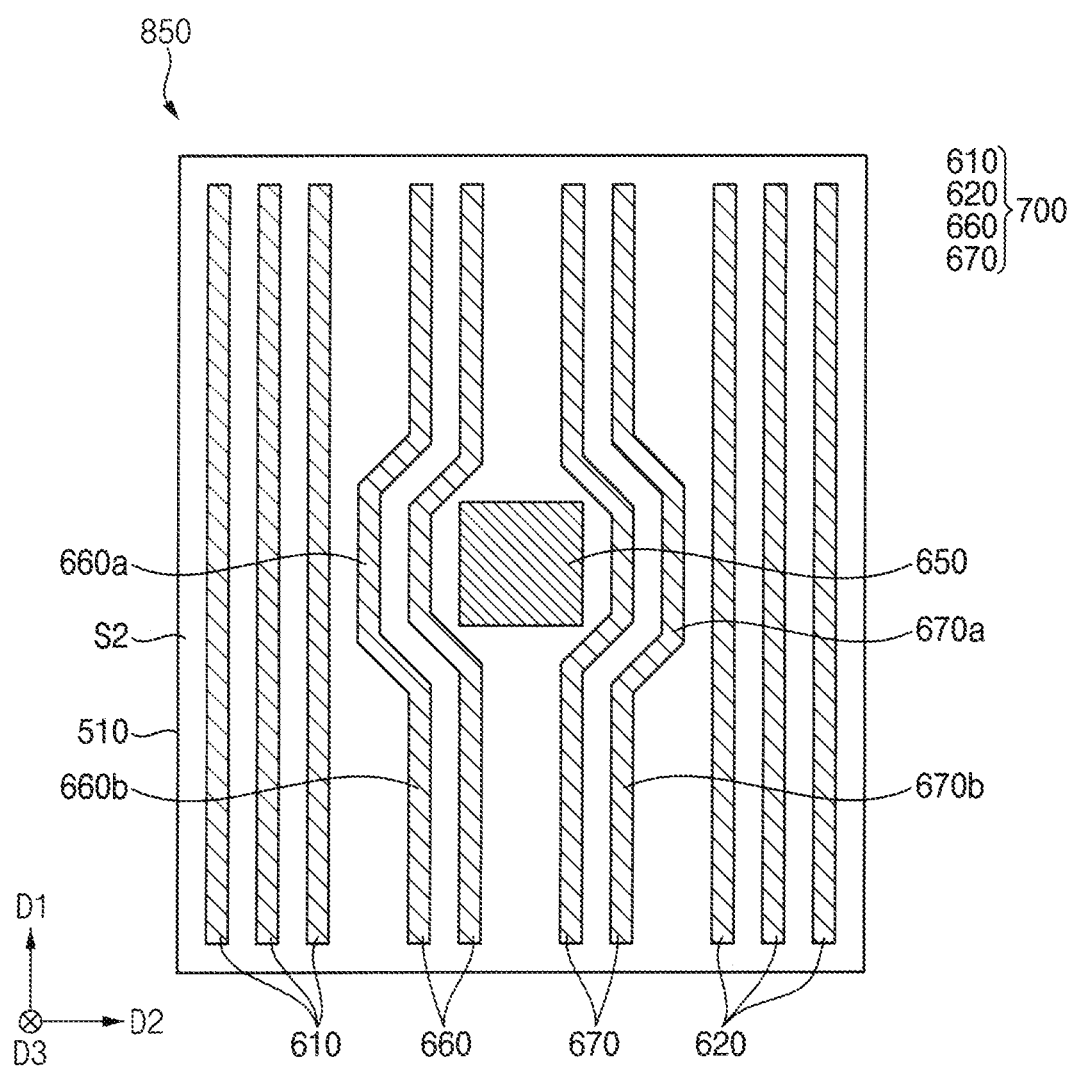
FIG. 4 is a plan view showing a film package according to an embodiment of the present inventive concepts.

FIG. 3 is a plan view showing a film package according to an embodiment of the present inventive concepts, and FIG. 4 is a plan view showing a film package according to an embodiment of the present inventive concepts. Each of film packages $00 and 850 illustrated in the embodiments of FIGS. 3 and 4 may have a configuration that is substantially identical or similar to the configuration of the film package 500 described with reference to the embodiments of FIGS. 1 and 2. In FIGS. 3 and 4, redundant descriptions of components that are substantially identical or similar to the components described with reference to FIGS. 1 and 2 will be omitted for convenience of explanation.

Referring to the embodiment of FIG. 3, the film package 800 may include a base substrate 510, pad wires 700, a light blocking member 650, and the like. In this embodiment, the pad wires 700 may include first pad wires 610 and second pad wires 620. In addition, the base substrate 510 may include a first surface S1 and a second surface S2.

When compared with the film package 500 shown in the embodiment of FIG. 1, first dummy patterns 630 and second dummy patterns 640 may not be included in the film package 800 shown in the embodiment of FIG. 3. For example, the film package 800 may include an empty space in a portion where the first dummy patterns 630 and the second dummy patterns 640 of FIG. 1 are disposed. For example, as shown in the embodiment of FIG. 3, the second surface S2 of the base substrate 510 may include an empty space between the first side of the light blocking member (e.g., an upper side of the light blocking member 650 in the first direction D1) and an upper edge of the base substrate in the first direction D1 and between the second side of the light blocking member (e.g., a lower side of the light blocking member 650 in the first direction D1) and a lower edge of the base substrate in the first direction D1. In an embodiment in which the film package 800 is electrically connected to the display device, the power supply voltage for driving the display device may be provided through the first and second pad wires 610 and 620, and the power supply voltage for driving the display device may not be provided to the light blocking member 650.

Referring to the embodiment of FIG. 4, the film package 850 may include a base substrate 510, pad wires 700, a light blocking member 650, and the like. In the embodiment of FIG. 4, the pad wires 700 may include first pad wires 610, second pad wires 620, third pad wires 660, and fourth pad wires 670, in addition, the base substrate 510 may include a first surface S1 and a second surface S2.

The third pad wires 660 may be disposed between the light blocking, member 650 and the first pad wires 610 (e.g., in the second direction D2) on the second surface S2 of the base substrate 510. The third pad wires 660 may be spaced apart front each other, and may be spaced apart from the first pad wires 610 and the light blocking member 650. Each of the third pad wires 660 may have a first extension part 660b and a first bent part 660a. For example, the first extension part 660b of each of the third pad wires 660 may extend longitudinally substantially in the first direction D1, and the first bent part 660a of each of the third pad wires 660 may be located along a profile of an outer periphery of the light blocking member 650 (e.g., a left side of the light blocking member 650 in the second direction D2) at a portion where the light blocking member 650 is located. For example, as shown in the embodiment of FIG. 4, a partial portion of the first bent part 660a immediately adjacent to the first extension part 660b may extend in a direction between the first and second directions D1, D2 along a profile of an outer periphery of the light blocking member 650 and may be connected to a partial portion of the first bent part 660a that extends substantially in the first direction D1.

In an embodiment of the present inventive concepts, when the film package 850 is electrically connected to the display device, the power supply voltage for driving the display device may be provided through the third pad wires 660. The third pad wires 660 may include at least one material selected from metal, an alloy, metal nitride, conductive metal oxide, a transparent conductive material, and the like. In other embodiments, the third pad wires 660 may have a multilayer structure including a plurality of metal layers. For example, the metal layers may have mutually different thicknesses, or may include mutually different materials.

The fourth pad wires 670 may be disposed between the light blocking member 650 and the second pad wires 620 on the second surface S2 of the base substrate 510. The fourth pad wires 670 may be spaced apart from each other, and may be spaced apart from the second pad wires 620 and the light blocking member 650. Each of the fourth pad wires 670 may have a second extension part 670b and a second bent part 670a. For example, the second extension part 670b of each of the fourth pad wires 670 may extend longitudinally substantially in the first direction D1, and the second bent part 670a of each of the fourth pad wires 670 may be located along a profile of an outer periphery of the light blocking member 650 (e.g., a right side of the light blocking member 650 in the second direction D2) at a portion where the light blocking member 650 is located. For example, as shown in the embodiment of FIG. 4, a partial portion of the second bent part 670a immediately adjacent to the second extension part 670b may extend in a direction between the first and second directions D1, D2 along a profile of an outer periphery of the light blocking member 650 and may be connected to a partial portion of the second bent part 670a that extends substantially in the first direction D1.

In an embodiment, when the film package 850 is electrically connected to the display device, the power supply voltage for driving the display device may be provided through the fourth pad wires 670. The fourth pad wires 670 may include at least one material selected from metal, an alloy, metal nitride, conductive metal oxide, a transparent conductive material, and the like. In other embodiments, the fourth pad wires 670 may have a multilayer structure including a plurality of metal layers. For example, the metal layers may have mutually different thicknesses, or may include mutually different materials.

Since the film package 850 according to an embodiment of the present inventive concepts includes the third and fourth pad wires 660 and 670 including the first and second bent parts 660a and 670a, arrangement of the pad wires 700 may be appropriately changed according to a shape of the arrangement of the pad electrodes disposed on the display device.

Figure 5:
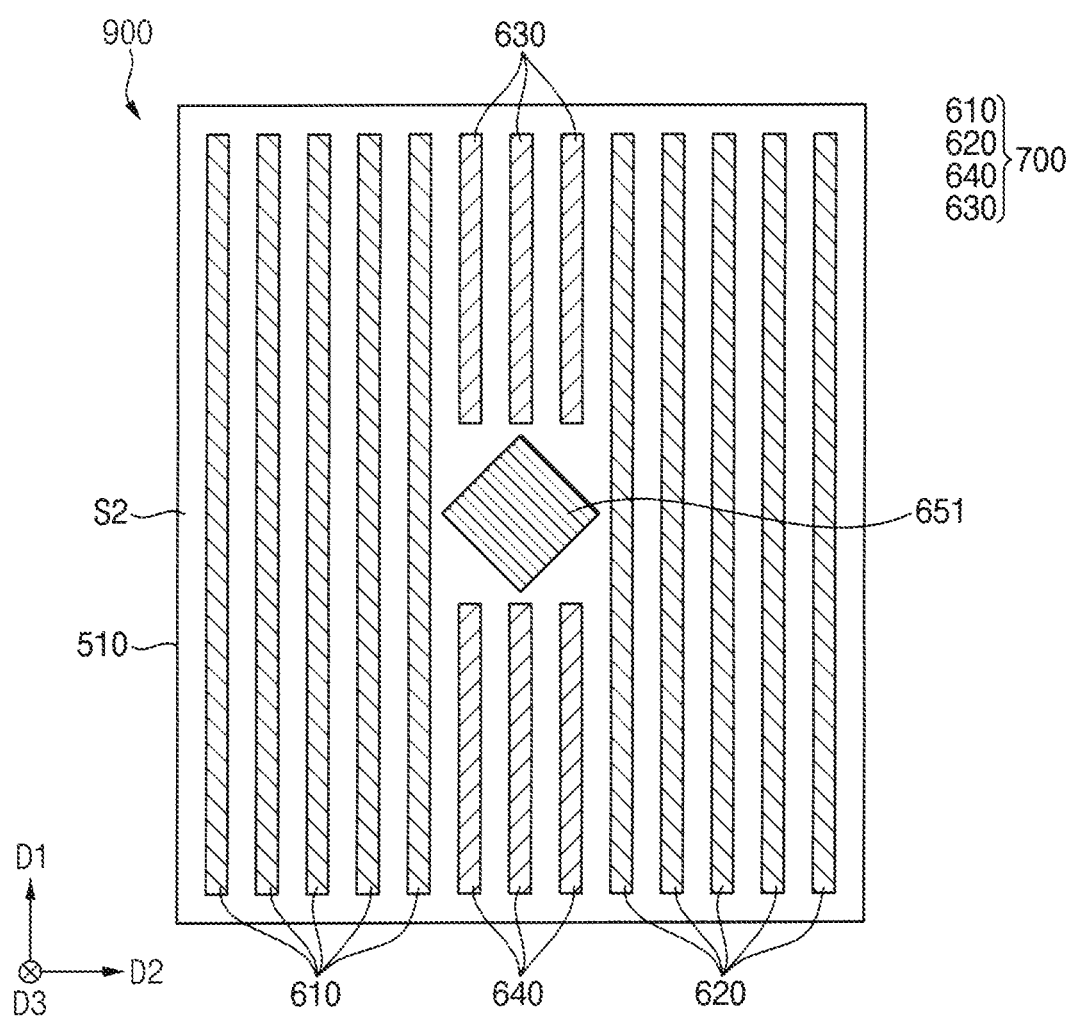
FIG. 5 is a plan view showing a film package according to an embodiment of the present inventive concepts.
Figure 6:
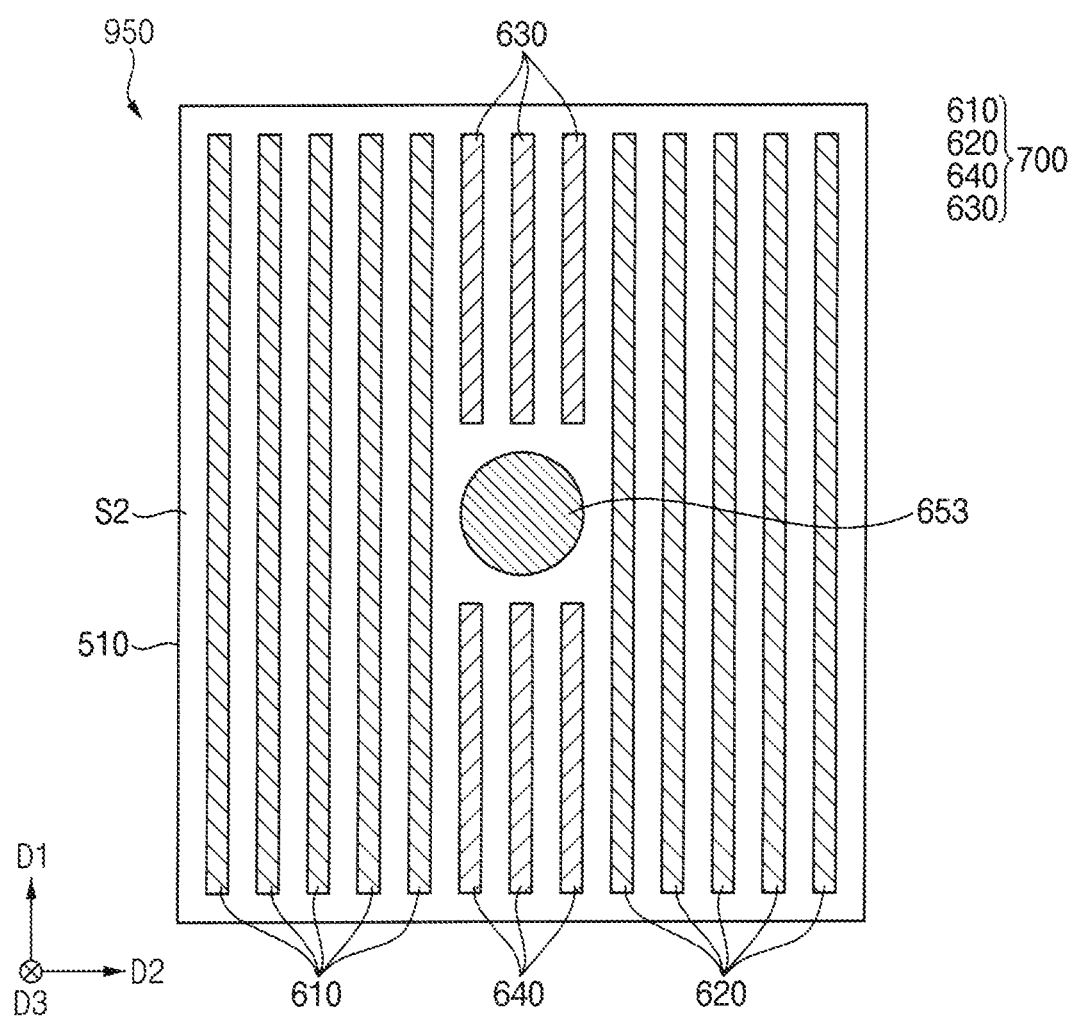
FIG. 6 is a plan view showing a film package according to an embodiment of the present inventive concepts.

FIG. 5 is a plan view showing a film, package according to an embodiment of the present inventive concepts, and FIG. 6 is a plan view showing a film package according to an embodiment of the present inventive concepts. Each of film packages 900 and 950 illustrated in FIGS. 5 and 6 may have configuration that is substantially identical or similar to the configuration of the film package 500 described with reference to the embodiments of FIGS. 1 and 2 except for a shape of the light blocking member 650. In the embodiments of FIGS. 5 and 6, redundant descriptions of components that are substantially identical or similar to the components described with reference to the embodiments of FIGS. 1 and 2 will be omitted for convenience of explanation.

Referring to the embodiment of FIG. 5, the film package 900 may include a base substrate 510, pad wires 700, a light blocking member 651, and the like. In the embodiment shown in FIG. 5, the pad wires 700 may include first pad wires 610, second pad wires 620, first dummy patterns 630, and second dummy patterns 640. In addition, the base substrate 510 may include a first surface S1 and a second surface S2.

In the embodiment shown in FIG. 5, the light blocking member 651 may have a rhombic shape when viewed in a plan view (e.g., in a plane defined in the first and second directions D1, D2).

Referring to the embodiment of FIG. 6, the film package 950 may include a base substrate 510, pad wires 700, a light blocking member 653, and the like. In the embodiment shown in FIG. 6, the pad wires 700 may include first pad Wires 610, second pad wires 620, first dummy patterns 630, and second dun y patterns 640. In addition, the base substrate 510 may include a first surface S1 and a second surface S2.

In the embodiment shown in FIG. 6, the light blocking member 653 may have a circular shape when viewed in a plan view (e.g., in a plane defined in the first and second directions D1, D2).

However, embodiments of the present inventive concepts are not limited thereto. For example, in another embodiment, each of the light blocking members 651 and 653 may have a triangular shape, a rectangular shape, a polygonal shape, a track shape, or an elliptical shape when viewed in a plan view (e.g in a plane defined in the first and second directions D1, D2).

FIGS. 7 to 12 are cross-sectional views showing a method of manufacturing a film package according to embodiments of the present inventive concepts.

Figure 7:
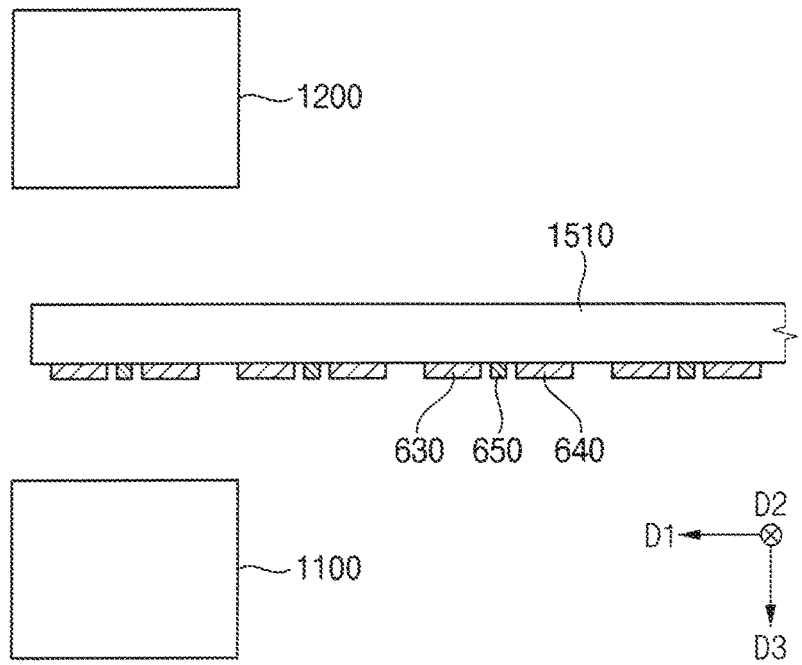
FIGS. 7 to 12 are cross-sectional views showing a method of manufacturing a film package according to embodiments of the present inventive concepts.

Referring to FIG. 7, the pad wires 700 (e.g, the first pad wires 610, the second pad wires 620, the first dummy patterns 630, and the second dummy patterns 640 as shown in the embodiment of FIG. 1) and the light blocking member 650 may be repeatedly formed on a bottom surface of a preliminary base substrate 1510. A partial portion of the preliminary base substrate 1510 may be located between a first measurement device 1100 and a second measurement device 1200 to measure a defect of the preliminary base substrate 1510.

Figure 8:
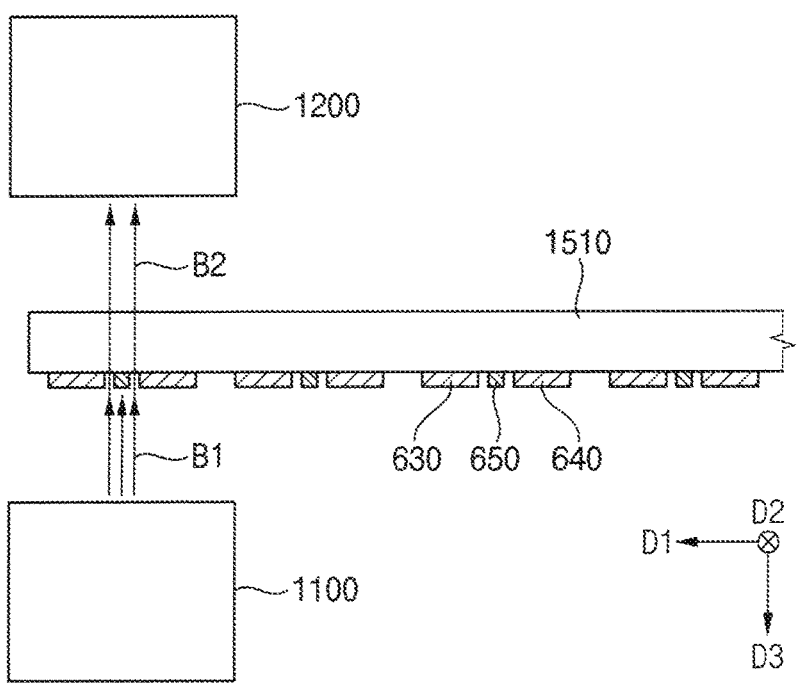

Referring to the embodiment of FIG. 8, a first light B1 may be emitted from the first measurement device 1100. The first light B1 may be transmitted through the preliminary base substrate 1510. For example, a partial portion of the first light B1 may be blocked by the light blocking member 650, and the remaining portion of the first light B1 may be transmitted so as to be defined as a second light B2. For example, as shown in the embodiment of FIG. 8, the first light B1 may be transmitted through the portion of the preliminary base substrate 1510 between the light blocking member 650 and the pad wires 700, such as the first and second dummy patterns 630, 640 to form a second light B2. The second light B2 may be transmitted through the base substrate 1510 and may be incident to the second measurement device 1200. A defect of the preliminary base substrate 1510 may be determined through the above process. For example, the light blocking member 650 may cause a difference in light transmittance which permits the defect of the preliminary base substrate 1510 to be detected. In this embodiment, the preliminary base substrate 1510 which is determined to have the defect may be moved in the first direction D1 without being cut.

Figure 9:
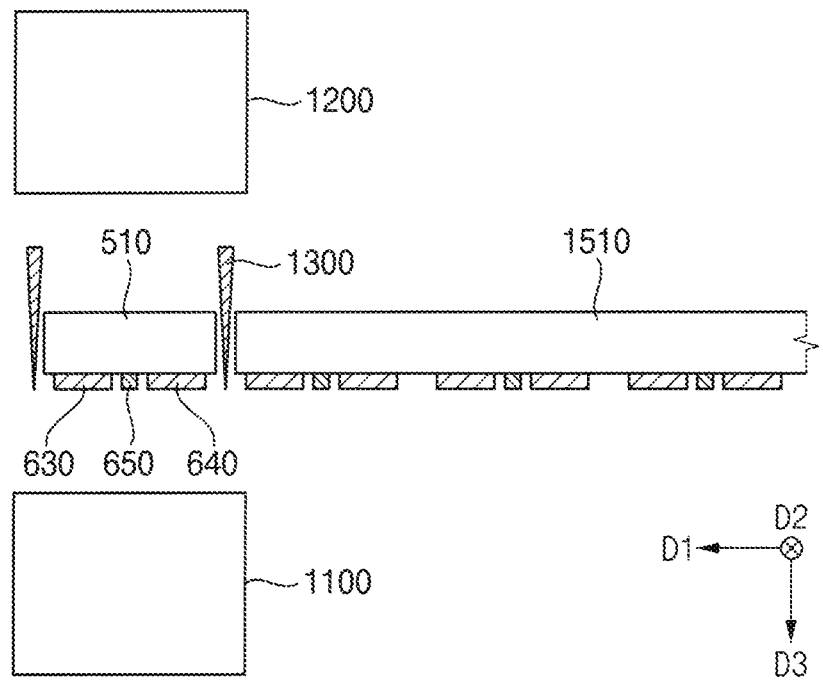

Referring to the embodiment of FIG. 9, when the preliminary base substrate 1510 is determined as having no defects based on differences in light transmittance through the preliminary base substrate 1510, the partial portion of the preliminary base substrate 1540 may be cut by using a cutting member 1300. In this embodiment, when the partial portion of the preliminary base substrate 1510 is cut, the light blocking member 650 may serve as a reference point. Accordingly, the film package 500 including the base substrate 510, the pad wires 700, and the light blocking member 650 may be manufactured.

Figure 10:
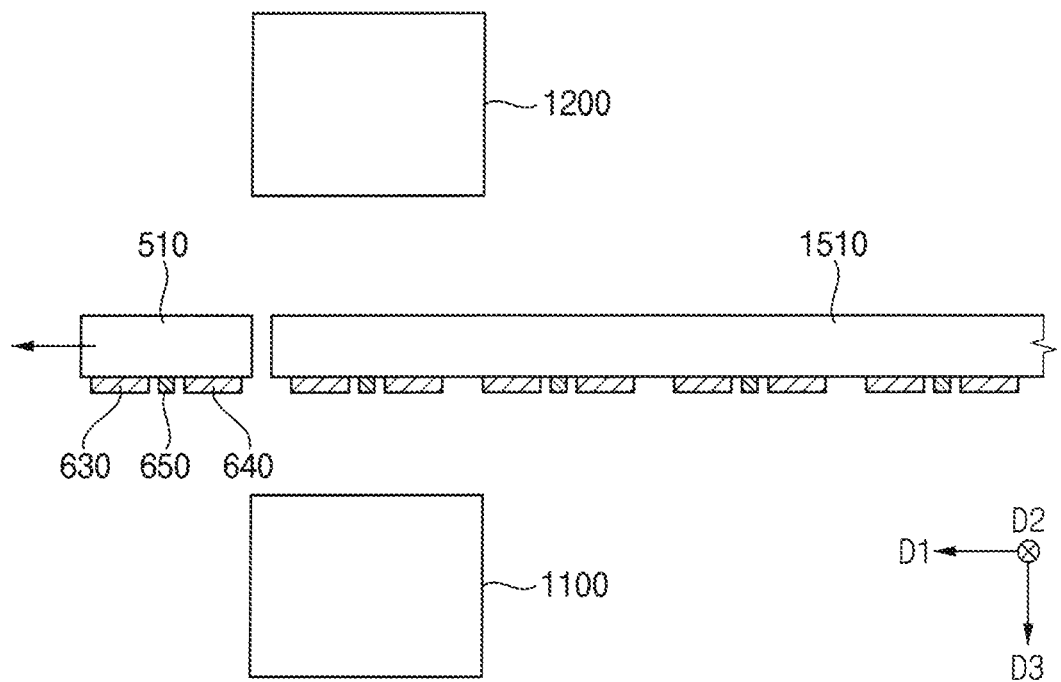

Referring to the embodiment f FIG. 10, the film package 500 may be moved in the first direction D1, and a partial portion of the preliminary base substrate 1510 may be located between the first measurement device 1100 and the second measurement device 1200.

Figure 11:
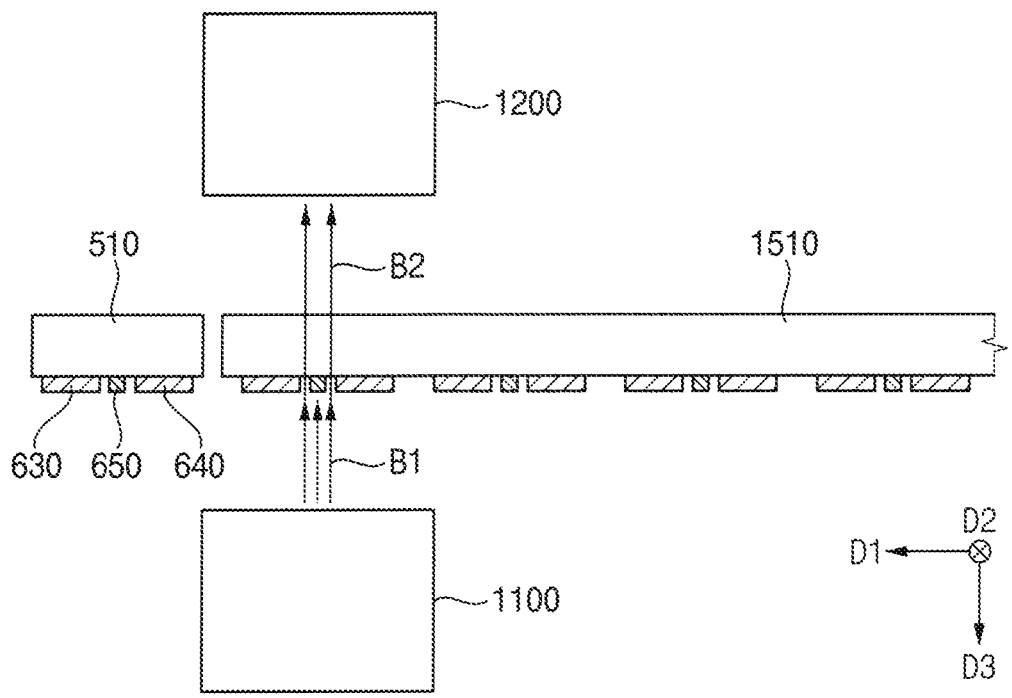

Referring to the embodiment of FIG. 11, the first light B1 may be emitted from the first measurement device 1100, and the second light B2 may be transmitted through the preliminary base substrate 1510.

Figure 12:
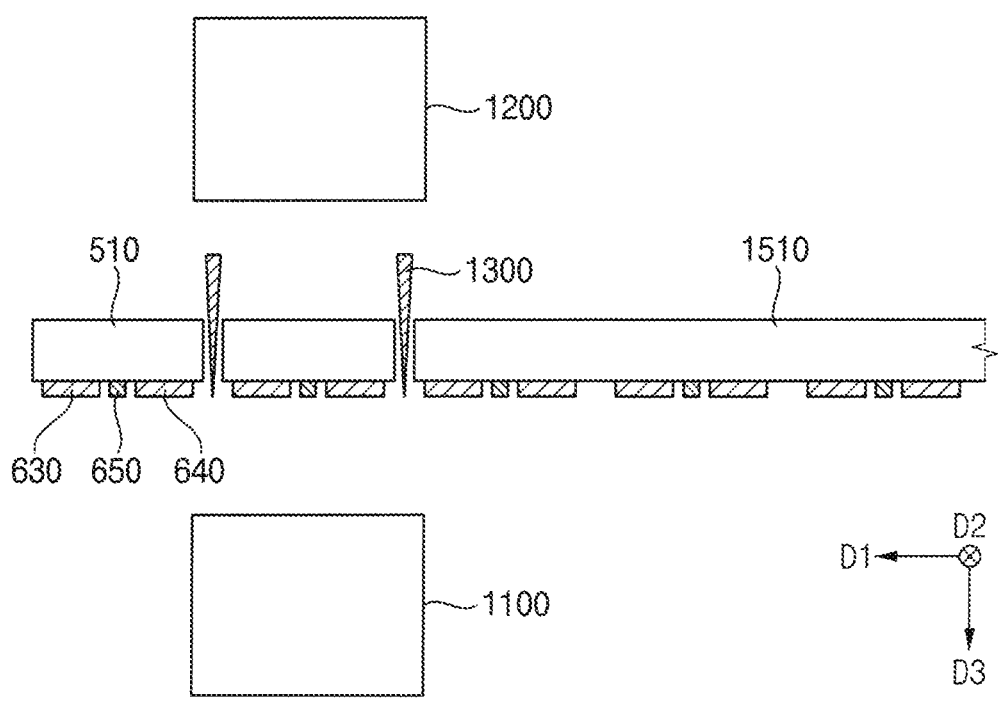

Referring to the embodiment of FIG. 12, when the preliminary base substrate 1510 is determined as having no defects based on differences in light transmittance through the preliminary base substrate 1510, the partial portion of the preliminary base substrate 1510 may be cut by using the cutting member 1300.

Accordingly, the method of manufacturing the film package shown in the embodiments of FIGS. 7 to 12 may be provided.

In the method of manufacturing the film package according to embodiments of the present inventive concepts, the light blocking member 650 is formed on the preliminary base substrate 1510 so that it may be accurately determined whether the preliminary base substrate 1510 has a defect due to the difference in light transmittance, and the light blocking member 650 functions as a reference point so that the preliminary base substrate 1510 may be accurately cut.

Figure 13:
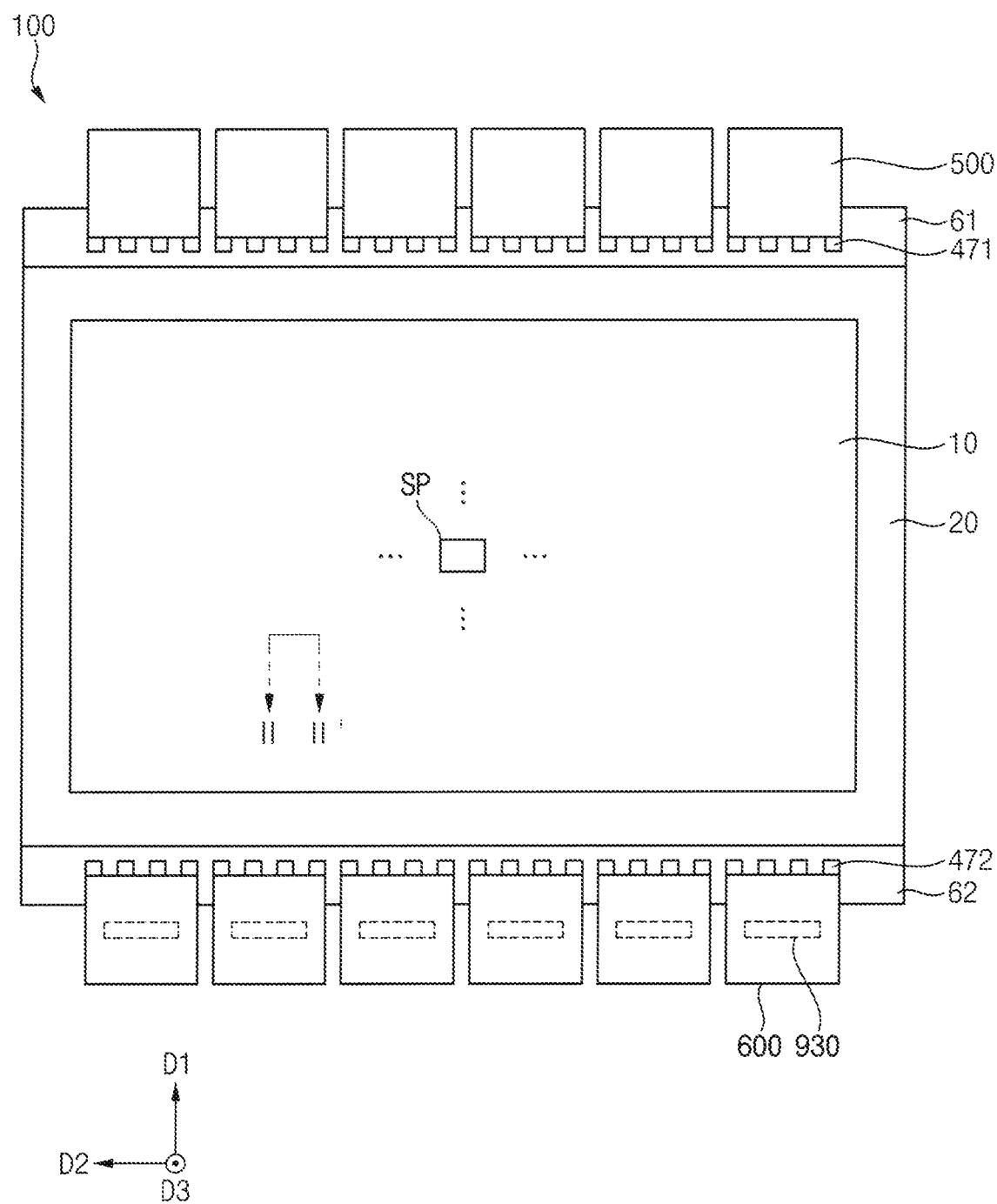
FIG. 13 is a plan view showing a display device according to an embodiment of the present inventive concepts.
Figure 14:
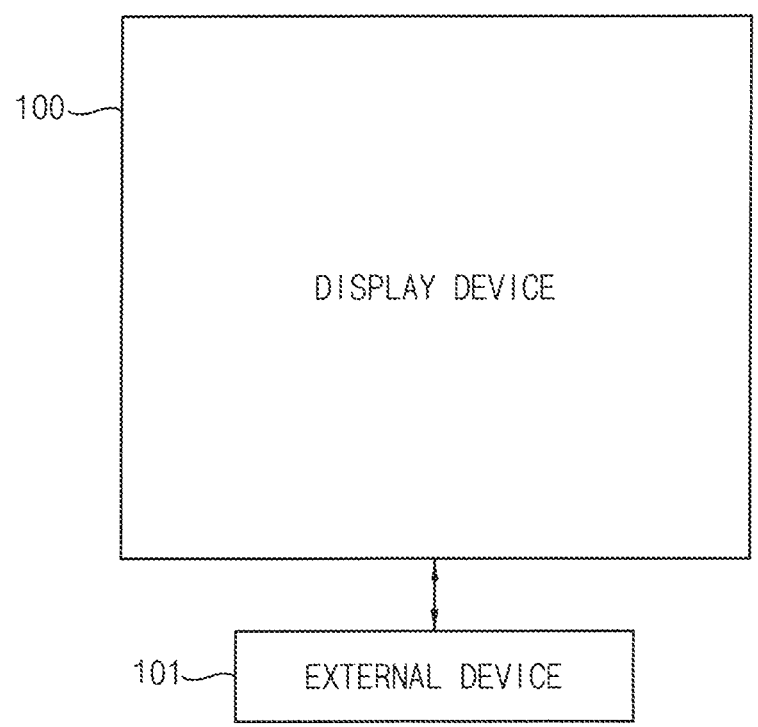
FIG. 14 is a block diagram showing an external device electrically connected to the display device of FIG. 13 according to an embodiment of the present inventive concepts.
Figure 15:
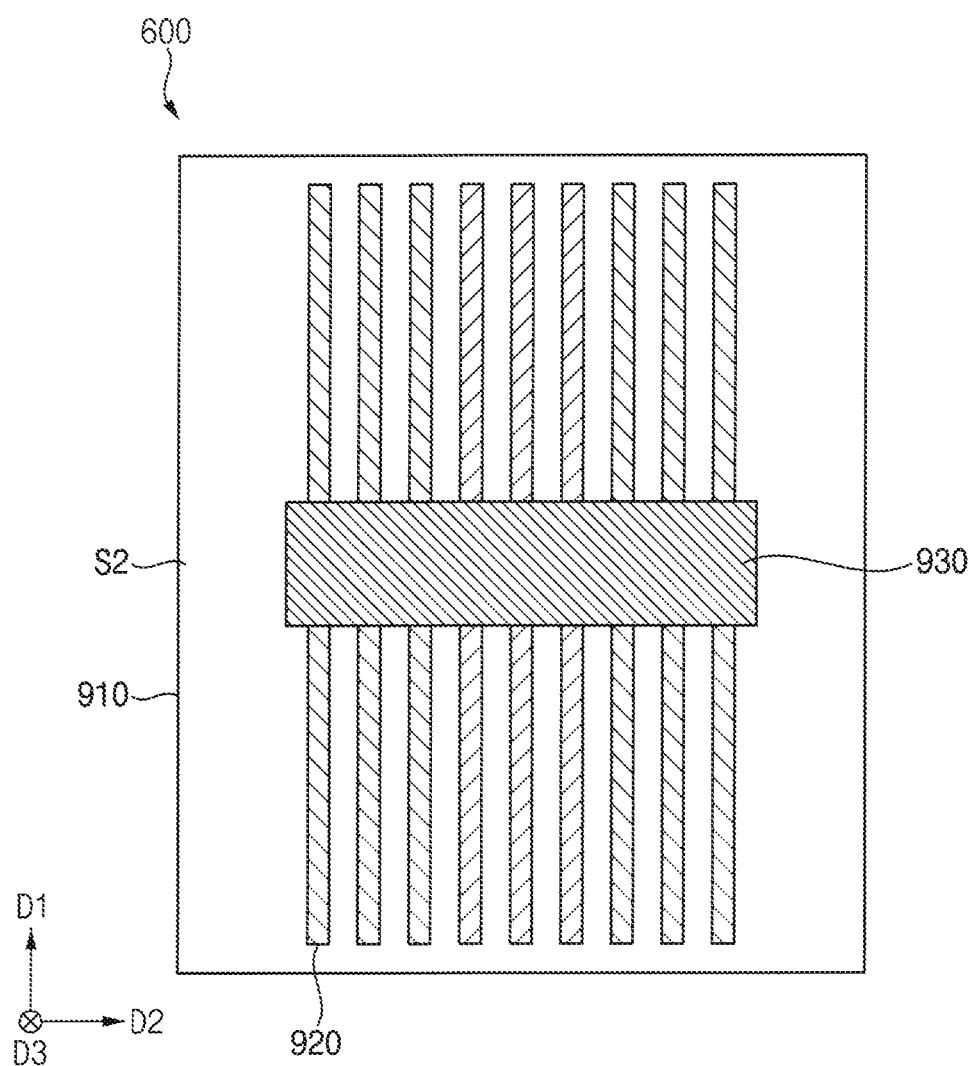
FIG. 15 is a plan view showing a second film package included in the display device of FIG. 13 according to an embodiment of the present inventive concepts.

FIG. 13 is a plan view showing a display device according to an embodiment of the present inventive concepts, and FIG. 14 is a block diagram showing an external device electrically connected to the display device of FIG. 13. FIG. 15 is a plan view showing a second film package included in the display device of FIG. 13.

Referring to the embodiments of FIGS. 13, 14, and 15, a display device 100 may include first pad electrodes 471, second pad electrodes 472, a first film package 500, a second film package 600, a sub-pixel SP, and the like. In an embodiment, the first film package 500 may include a base substrate 510, pad wires 700, and a light blocking member 650, and the second film package 600 may include a base substrate 910, pad wires 920, and a driver IC chip 910. The first film package 500 may not include a driver IC chip.

The display device 100 may include a display area 10, a peripheral area 20 that substantially surrounds the display area 10, a first pad area 61 located on one side of the peripheral area 20, and a second pad area 62 located on an opposite side of the peripheral area 20. For example, in the plan view of the display device 100 (e.g., in a plane defined in the first and second directions D1, D2), the first pad area 61 may be located on a first side of the display area 10, such as an upper side of the display area in the first direction D1 and the second pad area 62 may be located on a second side of the display area 10, such as a lower side of the display area in the first direction D1.

A plurality of sub-pixels SP may be arranged over the display area 10 in the first direction D1 and the second direction D2. Each of the sub-pixels SP may include transistors (e.g., a semiconductor element 250 of FIG. 17), an organic light emitting diode (a display structure 200 of FIG. 17), and the like. An image may be displayed on the display area 10 through the sub-pixels SP.

For example, in an embodiment the sub-pixels SP may include first, second, and third sub-pixels. The first sub-pixel may include a first organic light emitting diode for emitting red light, the second sub-pixel may include a second organic light emitting diode for emitting green light, and the third sub-pixel may include a third organic light emitting diode for emitting blue light. However, embodiments of the present inventive concepts are not limited thereto and the colors of the first to third organic light emitting diodes may vary.

In an embodiment, the first organic light emitting diode may overlap transistors included in the first sub-pixel, the second organic light emitting diode may overlap transistors included in the second sub-pixel, and the third organic light emitting diode may overlap transistors included in the third sub-pixel. In some embodiments, the first organic light emitting diode may overlap a partial portion of the transistors included in the first sub-pixel and a partial portion of transistors included in a sub-pixel that is different from the first sub-pixel, the second organic light emitting diode may overlap a partial portion of the transistors included in the second sub-pixel and a partial portion of transistors included in a sub-pixel different from the second sub-pixel, and the third organic light emitting diode may overlap a partial portion of the transistors included in the third sub-pixel and a partial portion of transistors included in a sub-pixel different from the third sub-pixel. For example, in an embodiment, the first to third organic light emitting diodes may be arranged by using an RGB stripe scheme in which rectangles having the same s are sequentially arranged, an S-stripe scheme including a blue organic light emitting diode having a relatively large area, a WRGB scheme further including a white organic light emitting diode, a PenTile scheme in which RG-GB patterns are repeatedly arranged, or the like.

In addition, the sub-pixel SP may include at least one driving transistor, at least one switching transistor, at least one capacitor, and the like. In an embodiment, the sub-pixel SP may include one driving transistor (e.g., a first transistor TR1 of FIG. 16), one switching transistor (e.g., a second transistor TR2 of FIG. 16), one storage capacitor (e.g., a storage capacitor CST of FIG. 16), and the like.

However, although the display device 100 according to the present inventive concepts has been described as having a rectangular shape when viewed in a plan view (e.g., in a plane defined in the first and second directions D1, D2) the shape of the display device 100 is not limited thereto. For example, in another embodiment, the display device 100 may have a triangular shape, a rhombic shape, a polygonal shape, a circular shape, an elliptical shape, or a track shape when viewed in a plan view.

A plurality of wires may be disposed in the peripheral area 20. For example, the wires may include a gate signal wire and the like. The wires may extend from the peripheral area 20 to the display area 10 to be electrically connected to the sub-pixels SR A gate driver and the like may also be disposed in the peripheral area 20.

The first pad electrodes 471 may be disposed in the first pad area 61, and the first film package 500 of the embodiments of FIGS. 1 and 2 may be disposed on the first pad electrodes 471. For example, an anisotropic conductive film (ACF) may be interposed between the first pad electrodes 471 and the first and second pad wires 610 and 620 disposed in a partial portion of the first film package 500 so as to bond and electrically connect the first pad electrodes 471 to the first film package 500.

As shown in the embodiments of FIGS. 1 and 2, the base substrate 510 may be provided. The base substrate 510 may include a flexible film including, a material having flexibility. In addition, the base substrate 510 may be transparent to allow external light to be transmitted therethrough.

The first pad wires 610 may be disposed on the first portion of the second surface S2 of the base substrate 510. Each of the first pad wires 610 may extend longitudinally in the first direction D1 parallel to the second surface S2 of the base substrate 510, and the first pad wires 610 may be spaced apart from each other in the second direction D2 orthogonal to the first direction D1 and parallel to the second surface S2 of the base substrate 510.

The second pad wires 620 may be disposed on second portion that is different from the first portion of the second surface S2 of the base substrate 510. Each of the second pad wires 620 may extend longitudinally in the first direction D1, and the second pad wires 620 may be spaced apart from each other in the second direction D2. For example, the second pad wires 620 may be spaced apart from the first pad wires 610 in the second direction D2, and the first pad wires 610 and the second pad wires 620 may extend parallel to each other.

The first dummy patterns 630 may be spaced apart from the first side of the light blocking member 650 (e.g, the upper side of the light blocking member 650) in the first direction D1 and disposed between the first and second pad wires 610 and 620 on the second surface S2 of the base substrate 510 (e.g., in the second direction D2). The first dummy patterns 630 may extend longitudinally in the first direction D1, and may be spaced apart from each other in the second direction D2. For example, the first dummy patterns 630 may be spaced apart from the first and second pad wires 610 and 620 (e.g., in the first direction D1), and the first dummy patterns 630 may extend parallel to the first and second pad wires 610 and 620.

The second dummy patterns 640 may be spaced apart from the second side of the light blocking member 650 (e.g, the lower side of the light blocking member 650) in the first direction D1 and may be disposed between the first and second pad wires 610 and 620 on the second surface S2 of the base substrate 510 (e.g. in the second direction D2). The second dummy patterns 640 may extend longitudinally in the first direction D1, and may be spaced apart from each other in the second direction D2. For example, the second dummy patterns 640 may be spaced apart from the first and second pad wires 610 and 620 in the second direction D2, and the second dummy patterns 640 may extend parallel to the first and second pad wires 610 and 620.

The light blocking member 650 may be disposed between the first pad wires 610 and the second pad wires 620 on the second surface S2 of the base substrate 510. For example, the light blocking member 650 may be located on the central portion of the second surface S2 of the base substrate 510. However, embodiments of the present inventive concepts are not limited thereto and in some embodiments, the light blocking member 650 may be disposed on the first surface S1 of the base substrate 510. In an embodiment, the light blocking member 650 may be spaced apart from the first and second pad wires 610 and 620. In addition, the light blocking member 650 may have a square shape when viewed in a plan view (e.g., in a plane defined in the first and second directions D1, D2).

The second pad electrodes 472 may be disposed in the second pad area 62, and only the second film package 600 of the embodiment of FIG. 15 may be disposed on the second pad electrodes 472. For example, an anisotropic conductive film may be interposed between the second pad electrodes 472 and the pad wires 920 disposed in a portion of the second film package 600 so as to bond and electrically connect the second pad electrodes 472 to the second film package 600.

As shown in the embodiment of FIG. 15 the base substrate 910 may be provided. The base substrate 910 may be substantially the same as the base substrate 510 of the first film package 500 shown in the embodiment of FIG. 1. For example, the base substrate 910 may include the same material as the first film package 500.

In an embodiment, the driver IC chip 930 may be disposed on a central portion of a second surface S2 of the base substrate 910. The driver IC chip 930 may receive an input signal (e.g., a data signal, a gate signal, etc.) and a driver IC power supply voltage from an external device 101, and the driver IC chip 930 may provide an output signal to the display device based on the input signal. Accordingly, the driver IC chip 930 may control driving of the display device 100.

The pad wires 920 may be disposed on the second surface S2 of the base substrate 910. For example, a partial portion of the pad wires 920 may be disposed at an upper portion of the driver IC chip 930, and may be electrically connected to the driver IC chip 930. In addition, the remaining portion of the pad wires 920 may be disposed at a lower portion of the driver IC chip 930, and may be electrically connected to the driver IC chip 930.

The pad wires 920 may include the same material as the pad wires 700 of the first film package 500 shown in FIG. 1.

The external device 101 miry be electrically connected to the display device 100 through the first film package 500 and the second film package 600. For example, one side of the first film package 500 may be electrically connected to the first pad electrodes 471, and an opposite side of the first film package 500 may be electrically connected to the external device 101. Its addition, one side of the second film package 600 may be electrically connected to the second pad electrodes 472, and an opposite side of the second pad electrodes 472 may be electrically connected to the external device 101. In addition, the external device 101 may generate a data signal, a gate signal, a first power supply voltage e.g., a low power supply voltage ELVSS of FIG. 16), a second power supply voltage (e.g., a high power supply voltage ELVDD of FIG. 16), and the like.

In an embodiment, the data signal and the gate signal generated from the external device 101 may be provided to the display device 100 through the second film package 600. For example, in an embodiment, the gate signal provided to the second pad electrodes 472 may move along a gate wire disposed in the peripheral area. 20, and may be provided to a gate electrode of a semiconductor element (e.g., corresponding to a gate electrode of the second transistor TR2 of FIG. 16) disposed in the display area 10. In addition, the data signal (e.g., a driving signal) provided to the second pad electrodes 472 may be provided to a data wire arranged in the first direction D1, which is a direction from the second pad area 62 to the first pad area 61, and may be provided to a source electrode of the semiconductor element (e.g., corresponding to a source electrode of the second transistor TR2 of FIG. 16). For example, the data signal may be sequentially provided to semiconductor elements electrically connected to the data wire extending in the first direction D1.

In an embodiment, the first power supply voltage and the second power supply voltage generated from the external device 101 may be provided to the display device 100 through the first film package 500. In this embodiment, the first power supply voltage may have a first power level, and the second power supply voltage ma have a second power level that is higher than the first power level. For example, the first power supply voltage provided to the first pad electrodes 471 may be provided to a cathode electrode (e.g., an upper electrode 340 of FIG. 17) disposed over the whole display area 10. In addition, the second power supply voltage provided to the first pad electrodes 471 may be provided to a power supply voltage wire arranged in one direction from the first pad area 61 to the second pad area 62 (e.g., a direction opposite to the first direction D1), and may be provided to a source electrode of a first semiconductor element (e.g., a source electrode of the first transistor TR1 of FIG. 16). For example, the second power supply voltage may be sequentially provided to first semiconductor elements electrically connected to the power supply voltage wire extending in the first direction D1. The second power supply voltage provided to the first semiconductor element may be provided to an anode electrode (e.g., a lower electrode 290 of FIG. 17).

Accordingly, the display device 100 including the first pad electrodes 471, the second pad electrodes 472, the first film package 500, the second film package 600, and the sub-pixel SP may be provided.

For example, the display device 100 may function as a display device configured to provide data signals in the first direction D1 and configured to provide, the power supply voltage in the direction opposite to the first direction D1. Accordingly, only the second film package 600 including the driver IC chip 930 may be disposed in the second pad area 62, and only the first film package 500 that does not include the driver IC chip 930 may be disposed m the first pad area 61.

Since the display device 100 according to embodiments of the present inventive concepts includes the first film package 500 including the light blocking member 650, defects of the first film package 500 may be reduced. Accordingly, defects of the display device 100 caused by the defects of the first film package 500 may also be reduced, so that a defect rate of the display device 100 may be reduced.

Figure 16:
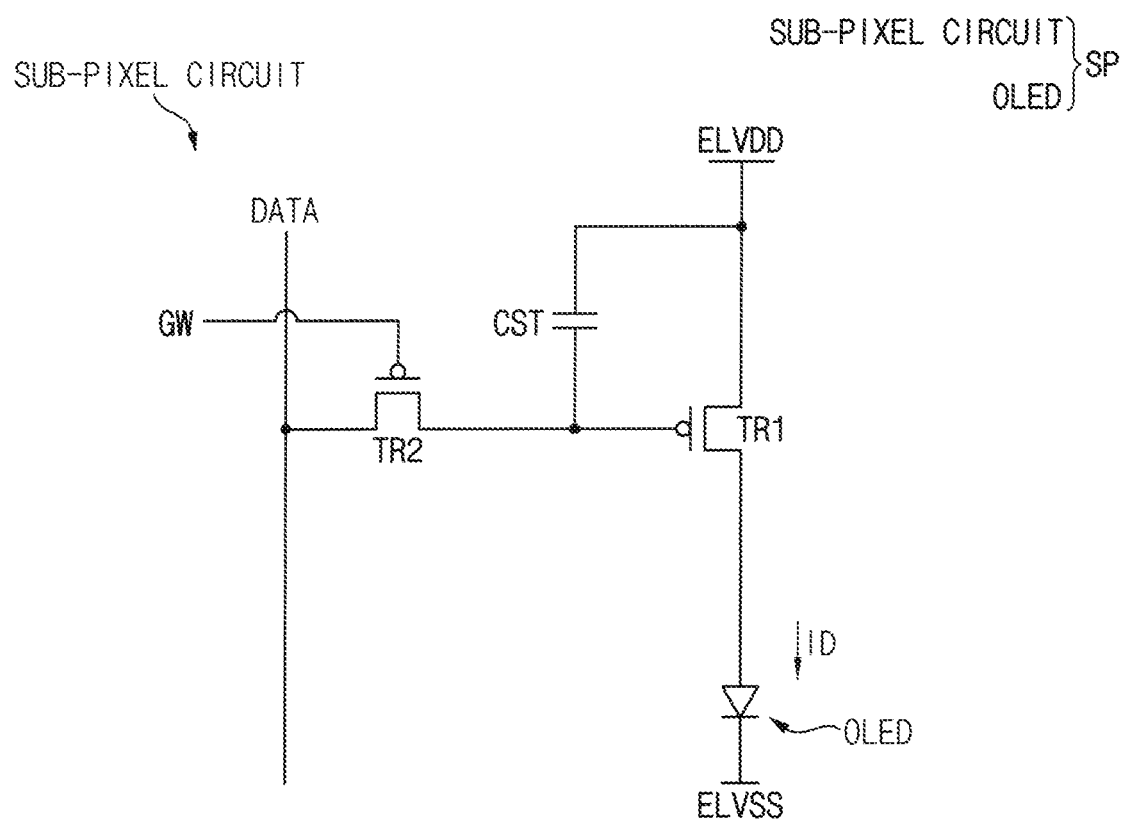
FIG. 16 is a circuit diagram showing a sub-pixel included in the display device of FIG. 13 according to an embodiment of the present inventive concepts.

FIG. 16 is a circuit diagram showing a sub-pixel included in the display device of FIG. 13 according to an embodiment of the present inventive concepts.

Referring to the embodiment of FIG. 16, the display device 100 may include a sub-pixel SP disposed in the display area 10, and the sub-pixel SP may include an organic light emitting diode OLED and a sub-pixel circuit SUB-PIXEL, CIRCUIT. In this embodiment, the sub-pixel circuit SUB-PIXEL CIRCUIT may include first and second transistors TR1 and TR2 (e.g., the semiconductor element 250 of FIG. 17), a storage capacitor CST, a high power supply voltage (ELVDD) wire, a low power supply voltage (ELVSS) wire, a data signal (DATA) wire, a gate signal (GW) wire, and the like.

The first transistor TR1 may be a driving transistor, and the second transistor TR2 may be a switching transistor. Each of the first and second transistors TR1 and TR2 may include a first terminal, a second terminal, a channel, and a gate terminal. In an embodiment, the first terminal may be a source terminal, and the second terminal may be a drain terminal. However, embodiments of the present inventive concepts are not limited thereto and in some embodiments, the first terminal may be a drain terminal, and the second terminal may be a source terminal.

The organic light emitting diode OLED may output light based on a driving current ID. The organic light emitting diode OLED may include a first terminal and a second terminal. In an embodiment, the second terminal of the organic light emitting diode OLEO may receive a low power supply voltage ELVSS (e.g., the first power supply voltage provided through the first film package 500 of the embodiment of FIG. 13), and the first terminal of the organic light emitting diode OLED may receive a high power supply voltage ELVDD (e.g., the second power supply voltage provided through the first film package 500 of the embodiment of FIG. 13). For example, the first terminal of the organic light emitting: diode OLED may be an anode terminal, and the second terminal of the organic light emitting diode OLED may be a cathode terminal. However, embodiments of the present inventive concepts are not limited thereto and in some embodiments the first terminal of the organic light emitting diode OLED may be a cathode terminal, and the second terminal of the organic light emitting diode OLED may be an anode terminal. In an embodiment, the anode terminal of the organic light emitting diode OLED may correspond to the lower electrode 290 of the embodiment of FIG. 17, and the cathode terminal of the organic light emitting diode OLED may correspond to the upper electrode 340 of the embodiment of FIG. 17.

As shown in the embodiment of FIG. 16, the gate terminal of the first transistor TR1 may be connected to the second terminal of the second transistor TR2, the first terminal of the first transistor TR1 may be connected to the high power supply voltage (ELVDD) wire, and the second terminal of the first transistor TR1 may be connected to the anode electrode. The first transistor TR1 may generate the driving current ID. In an embodiment, the first transistor TR1 may operate in a saturation region. In this embodiment, the first transistor TR1 may generate the driving current ID based on a voltage difference between the gate terminal and the source terminal. In addition, gray levels may be expressed based on a magnitude of the driving current ID supplied to the organic light emitting diode OLED. In some embodiments, the first transistor TR1 may operate in a linear region. In this embodiment, the gray levels may be expressed based on the sum of a time during which the driving current is supplied to the organic light emitting diode OLED within one frame.

The gate terminal of the second transistor TR2 may receive a gate signal GW (e.g., the gate signal provided through the second film package 600 of the embodiment of FIG. 13). The first terminal of the second transistor TR2 may receive a data signal DATA. The second terminal of the second transistor TR2 may be connected to the first terminal of the first transistor TR1. For example, the gate signal GW may be provided from the gate driver, and the gate signal GW may be applied to the gate terminal of the second transistor TR2 through the gate signal (GW) wire. The second transistor TR2 may supply the data signal DATA to the first terminal of the first transistor TR1 during an activation period of the gate signal GW. In this embodiment, the second transistor. TR2 may operate in a linear region.

The storage capacitor CST may include a first terminal and a second terminal. The storage capacitor CST may be connected between the high power supply voltage (ELVDD) wire and the gate terminal of the first transistor TR1. For example, the first terminal of the storage capacitor CST may be connected to the state terminal of the first transistor TR1, and the second terminal of the storage capacitor CST may be connected to the high power supply voltage (ELVDD) wire. The storage capacitor CST may maintain a voltage level of the gate terminal of the first transistor TR1 during an inactivation period of the gate signal GW. During the inactivation period of the gate signal GW, the driving current ID generated by the first transistor TR1 may be supplied to the organic light emitting diode OLED. Therefore, the driving current ID generated by the first transistor TR1 may be supplied to the organic light emitting diode OLED based on the voltage level maintained by the storage capacitor CST.

However, although the sub-pixel circuit SUB-PIXEL CIRCUIT according to an embodiment of the present inventive concepts has been described as including two transistors and one storage capacitor, embodiments of the present inventive concepts are not limited thereto. For example, the sub-pixel circuit SUB-PIXEL CIRCUIT may have a configuration including at least three transistors and at least one storage capacitor, etc.

Figure 17:
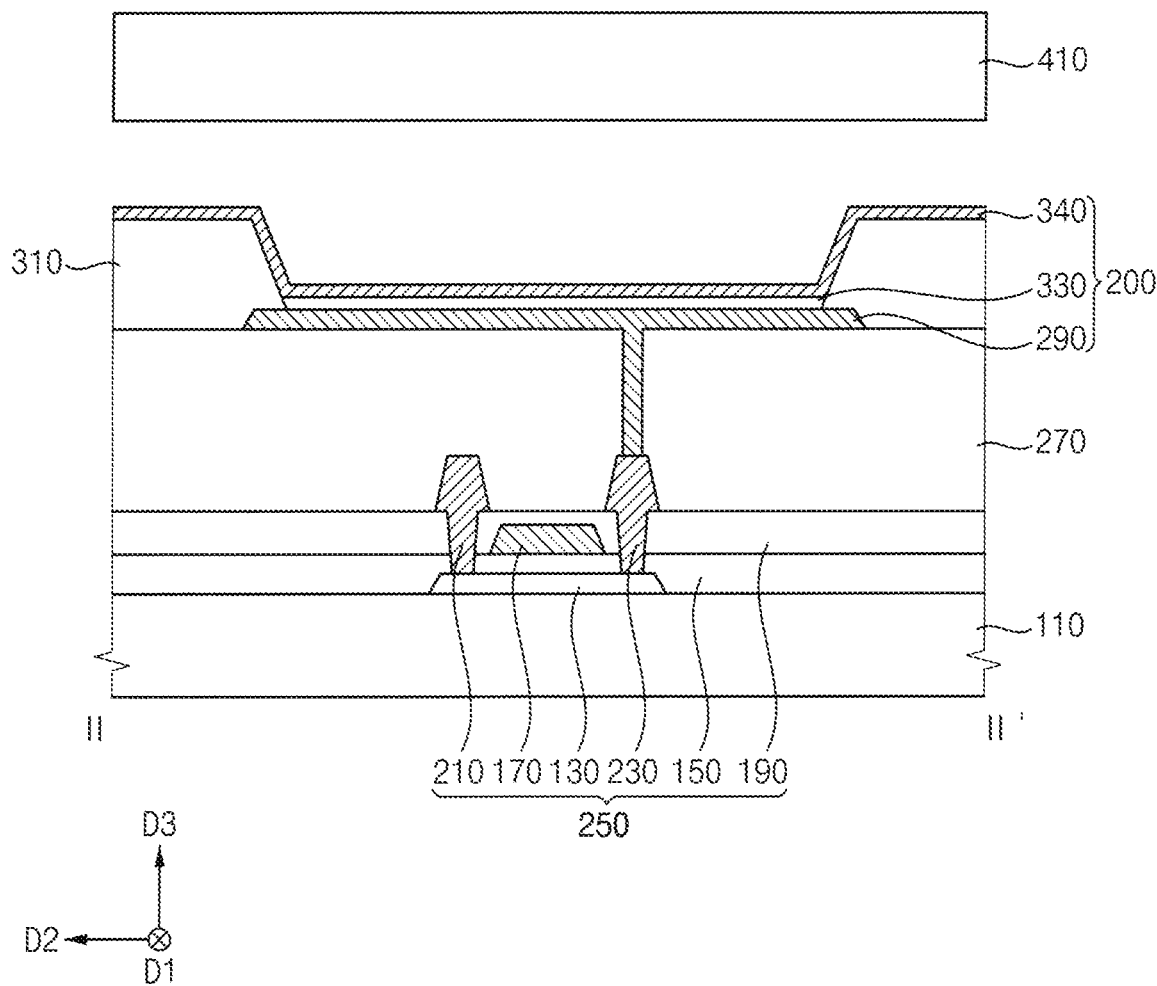
FIG. 17 is a cross-sectional view taken along line of FIG. 13 according to an embodiment of the present inventive concepts.

FIG. 17 is a cross-sectional view taken along line II-II' of FIG. 13 according to an embodiment of the present inventive concepts.

Referring to the embodiment of FIG. 17, the display device 100 may include a semiconductor element 250, a planarization layer 270, a pixel defining layer 310, and a display structure 200. In this embodiment, the semiconductor element 250 may include an active layer 130, a gate insulating layer 150, a gate electrode 170, an interlayer insulating layer 190, a source electrode 210, and a drain electrode 230, and the display structure 200 may include a lower electrode 290, a light emitting layer 330, and an upper electrode 340.

A lower substrate 110 including a transparent or opaque material may be provided. In an embodiment, the lower substrate 110 may include a quartz substrate, a synthetic quartz substrate, a calcium fluoride substrate, a fluorine-doped quartz (F-doped quartz) substrate, a soda lime glass substrate, a non-alkali glass substrate, and the like. In other embodiments, the lower substrate 110 may be a transparent resin substrate having flexibility. Examples of the transparent resin substrate that may be used as the lower substrate 110 include a polyimide substrate. However, embodiments of the present inventive concepts are not limited thereto. In this embodiment, the polyimide substrate may include a first polyimide layer, a barrier film layer, and a second polyimide layer.

In an embodiment, a buffer layer may be disposed on the lower substrate 110. For example, the buffer layer may be disposed over the whole lower substrate 110. The buffer layer may prevent metal atoms impurities from diffusing from the lower substrate 110, and may control a heat transfer rate during a crystallization process for forming the active layer 130 to obtain a substantially uniform active layer 130. In addition, when a surface of the lower substrate 110 is not uniform, the buffer layer may serve to improve flatness of the surface of the lower substrate 110. In an embodiment, depending on a type of the lower substrate 110, at least two buffer layers may be provided on the lower substrate 110, or the buffer layer may not be provided. In an embodiment, the buffer layer may include a silicon compound, metal oxide, and the like. However, embodiments of the present inventive concepts are not limited thereto.

The active layer 130 may be disposed on the lower substrate 110. For example, as shown in the embodiment of FIG. 17, a lower surface of the active layer 130 may directly contact an upper surface of the lower substrate 110. In an embodiment, the active layer 130 may include a metal oxide semiconductor, an inorganic semiconductor (e.g., amorphous silicon or poly silicon), an organic semiconductor, or the like. The active layer 130 may have a source region and a drain region.

The gate insulating layer 150 may be disposed on the active layer 130. For example, as shown in the embodiment of FIG. 17, a lower surface of the gate insulating layer 150 may directly contact upper and lateral side surfaces of the active layer 30. The gate insulating layer 150 may cover the active layer 110, and may be disposed on the lower substrate 110. For example, the gate insulating layer 150 may cover the active layer 130, and may have a substantially flat top surface without creating a step around the active layer 130. In some embodiments, the gate insulating layer 150 may be disposed along a profile of the active layer 130 with a uniform thickness to cover the active layer 110 on the lower substrate 110. In an embodiment, the gate insulating layer 150 may include a silicon compound, metal oxide, and the like. For example, the gate insulating layer 150 may include at least one compound selected from silicon oxide ($SiO_x$), silicon nitride ($SiN_x$), silicon oxynitride ($SiO_xN_y$), silicon oxycarbide $SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other embodiments, the gate insulating layer 150 may have a multilayer structure including a plurality of insulating layers. For example, the insulating layers may have mutually different thicknesses, or may include mutually different materials.

The gate electrode 170 may be disposed on a partial portion of the gate insulating layer 150 under which the active layer 130 is located. The gate electrode 170 may overlap the active layer 130 (e.g., in the third direction D3). In an embodiment, the gate electrode 170 may include at least one material selected from metal, an alloy, metal nitride, conductive metal oxide, a transparent conductive material, and the like. In other embodiments, the gate electrode 170 may have a multilayer structure including a plurality of metal layers. For example, the metal layers may have mutually different thicknesses, or may include mutually different materials.

The interlayer insulating layer 190 may be disposed on the gate electrode 170. For example, as shown in the embodiment of FIG. 17, a lower surface of the interlayer insulating layer 190 may directly contact upper and lateral side surfaces of the gate electrode 170. The interlayer insulating layer 190 may cover the gate electrode 170, and may be disposed on the gate insulating layer 150. For example, the interlayer insulating layer 190 may sufficiently cover the gate electrode 170 on the gate insulating layer 150, and may have a substantially flat top surface without creating a step around the gate electrode 170. In some embodiments, the interlayer insulating layer 190 may be disposed along a profile of the gate electrode 170 with a uniform thickness to cover the gate electrode 170 on the gate insulating layer 150. In a a embodiment, the interlayer insulating layer 190 may include a silicon compound, metal oxide, and the like. In other embodiments, the interlayer insulating layer 190 may have a multilayer structure including a plurality of insulating layers. For example, the insulating layers may have mutually different thicknesses, or may include mutually different materials.

The source electrode 210 and the drain electrode 230 may be disposed on the interlayer insulating layer 190. The source electrode 210 and the drain electrode 230 may be connected to the source region and the drain region of the active layer 130, respectively, through contact holes formed by removing parts of the gate insulating layer 150 and the interlayer insulating layer 190, in an embodiment, each of the source electrode 210 and the drain electrode 230 may include at least one material selected from metal, an alloy, metal nitride, conductive metal oxide, a transparent conductive material, and the like. In other embodiments, each of the source electrode 210 and the drain electrode 230 may have a multilayer structure including a plurality of metal layers. For example, the metal layers may have mutually different thicknesses, or ma include mutually different materials.

Accordingly, the semiconductor element 250 including the active layer 130, the gate insulating layer 150, the gate electrode 170, the interlayer insulating layer 190, the source electrode 210, and the drain electrode 230 may be provided.

However, although the semiconductor element 250 in the embodiment of FIG. 17 has a top gate structure, embodiments of the present inventive concepts are not limited thereto. For example, the semiconductor element 250 may have a bottom gate structure, a double gate structure, etc.

The planarization layer 270 may be disposed on the source electrode 210 and the drain electrode 230. The planarization layer 270 may cover the source electrode 210 and the drain electrode 230. For example, as shown in the embodiment of FIG. 17, the planarization layer 270 may directly contact an upper surface and lateral side surfaces of the source electrode 210 and the drain electrode 230 and an upper surface of the interlayer insulating layer 190. The planarization layer 270 may be disposed over the whole interlayer insulating layer 190. For example, the planarization layer 270 may have a relatively thick thickness to sufficiently cover the source electrode 210 and the drain electrode 230. In this embodiment, the planarization layer 270 may have a substantially flat top surface. A planarization process may be additionally performed on the planarization layer 270 to implement such a flat top surface of the planarization layer 270. In some embodiments, the planarization layer 270 may be disposed along a pr file of the source electrode 210 and the drain electrode 230 with a uniform thickness to cover the source electrode 210 and the drain electrode 230. The planarization layer 270 may be formed of an organic insulating material or an inorganic insulating material. In an embodiment, the planarization layer 270 may include an organic material. For example, the organic insulating material may include at least one material selected from photoresist, acryl, polyacryl, polyimide, polyamide, epoxy, acrylate monomers, phenylacetylene, diamine, dianhydride, siloxane polysiloxane, silane, parylene, olefin-based polymers (polyethylene or polypropylene), polyethylene terephthalate, fluorine, and the like. In embodiments, the planarization layer 270 may include a resin including the organic insulating material as a base material.

The lower electrode 290 may be disposed on the planarization layer 270. For example, as shown in the embodiment of FIG. 17, a lower surface of the lower electrode 290 may directly contact an upper surface of the planarization layer 270. The lower electrode 290 may be connected to the drain electrode 230 through a contact hole formed by removing a partial portion of the planarization layer 270. In addition, the lower electrode 290 may be electrically connected to the semiconductor element 250. In an embodiment, the lower electrode 290 may include at least one material selected from a metal, an alloy, metal nitride, conductive metal oxide, a transparent conductive material, and the like. In other embodiments, the lower electrode 290 may have a multilayer structure including a plurality of metal layers. For example, the metal layers may have mutually different thicknesses, or may include mutually different materials.

The pixel defining layer 310 may be disposed on the planarization layer 270, and may expose a partial portion of a top surface of the lower electrode 290. For example, as shown in the embodiment of FIG. 17, the pixel defining layer 310 may expose a central portion of the top surface of the lower electrode 290. The pixel defining layer 310 may be formed of are organic insulating material or an inorganic insulating material. For example, in an embodiment, the pixel defining layer 310 may include an organic insulating material.

The light emitting layer 330 may be disposed on at least a partial portion of the top surface of the lower electrode 290 that is exposed by the pixel defining layer 310. In an embodiment, the light emitting layer 330 may be formed by using at least one of light emitting materials for emitting different color lights (e.g., red light, green light, blue light, etc.) according to the sub-pixels. Alternatively, the light emitting layer 330 may be formed by stacking a plurality of light emitting materials for generating different color lights such as red light, green light, and blue light to emit white light as a whole. In this embodiment, a color filter may be disposed on the light emitting layer 330. The color filter may include at least one of a red color filter, a green color filter, and a blue color filter, in sortie embodiments, the color filter may include a yellow color filter, a cyan color filter, and a magenta color filter. However, embodiments of the present inventive concepts are not limited thereto. The color filter may include a photosensitive resin or a color photoresist.

The upper electrode 340 may be disposed on the pixel defining layer 310 and the light emitting layer 330. For example, as shown in the embodiment of FIG. 7, a lower surface of the upper electrode 340 may directly contact an upper surface of the pixel defining layer 310 and an upper surface of the light emitting layer 330. The upper electrode 340 may include at least one material selected from a metal, an alloy, metal nitride, conductive metal oxide, a transparent conductive material, and the like. In other embodiments, the upper electrode 340 may have a multilayer structure including a plurality of metal layers. For example, the metal layers may have mutually different thicknesses, or may include mutually different materials.

Although the display device 100 according to an embodiment of the present inventive concepts has been described as specifically being an organic light emitting diode display device, embodiments of the present inventive concepts are not limited thereto. For example, in other embodiments, the display device 100 may include a liquid crystal display device (LCD), a field emission display device (FED), a plasma display device (PDP), or an electrophoretic display device (EPD).

The present inventive concepts may be applied to various electronic devices having a display device including a film package. For example, the present inventive concepts may be applied to various different electronic devices such as vehicle-display devices, ship-display devices, aircraft-display devices, portable communication devices, display devices for display or for information transfer, medical-display devices, etc.

The foregoing is illustrative of embodiments of the present inventive concepts and is not to be construed as limiting thereof. Although a few embodiments have been described, those skilled in the an will readily appreciate that many modifications are possible in the embodiments without materially departing from the present inventive concepts. Accordingly, all such modifications are intended to be included within the scope of the present inventive concepts. Therefore, it is to be understood that the foregoing is illustrative of various embodiments of the present inventive concepts and the present inventive concepts are not to be construed as limited to the specific embodiments disclosed, and that modifications to the disclosed embodiments, as well as other embodiments, are intended to be included within the scope of the present inventive concepts.

What is claimed is:

1. A film package comprising:
a base substrate having a bottom surface that includes a first portion and a second portion that are spaced apart from each other in a first direction;
first pad wires disposed on the first portion of the bottom surface of the base substrate and extending in a second direction perpendicular to the first direction;
second pad wires disposed on the second portion of the bottom surface of the base substrate and extending in the second direction;
a light blocking member disposed between the first pad wires and the second pad wires in the first direction;
first dummy patterns disposed on the bottom surface of the base substrate adjacent to and spaced apart from a first side of the light blocking member in the second direction,
the first dummy patterns being disposed between the first pad wires and the second pad wires in the first direction, each of the first dummy patterns extending parallel to the first pad wires and the second pad wires; and
second dummy patterns disposed on the bottom surface of the base substrate adjacent to and spaced apart from a second side of the light blocking member in the second direction, the second dummy patterns being disposed between the first pad wires and the second pad wires in the first direction, each of the second dummy patterns extending parallel to the first pad wires and the second pad wires,
wherein the first and second pad wires are configured for receiving a power supply voltage, and the first and second dummy patterns are not configured for receiving the power supply voltage, wherein the first and second pad wires and the first and second dummy patterns are composed of a similar material as each other.

2. The film package of claim 1, wherein the light blocking member is disposed on the bottom surface of the base substrate and is spaced apart from the first pad wires and the second pad wires.

3. The film package of claim 1, further comprising:
third pad wires disposed on the bottom surface of the base substrate and positioned between the light blocking member and the first pad wires, the third pad wires having a first bent part disposed along a profile of an outer periphery of the light blocking member at a portion where the light blocking member is located; and
fourth pad wires disposed on the bottom surface of the base substrate and positioned between the light blocking member and the second pad wires, the fourth pad wires having a second bent part disposed along a profile of an outer periphery of the light blocking member at a portion where the light blocking member is located.

4. The film package of claim 1, wherein:
the film package is configured to block external light from being transmitted through a partial portion of the base substrate in which the first and second pad wires and the light blocking member are disposed; and
the film package is configured to transmit external light through a partial portion of the base substrate in which the first and second pad wires and the light blocking member are not disposed.

5. A display device comprising:
a substrate having a display area, a first pad area disposed on a first side of the display area, and a second pad area disposed on a second side of the display area;
display structures disposed on the substrate in the display area;
first pad electrodes disposed on the substrate in the first pad area;
second pad electrodes disposed on the substrate in the second pad area; and
a first film package electrically connected to the first pad electrode, and including a first base substrate having a bottom surface that includes a first portion and a second portion that are spaced apart from each other in a first direction;
first pad wires disposed on the first portion of the bottom surface of the first base substrate and extending in a second direction perpendicular to the first direction,
second pad wires disposed on the second portion of the bottom surface of the first base substrate and extending in the second direction,
a light blocking member disposed between the first pad wires and the second pad wires in the first direction,
first dummy patterns disposed on the bottom surface of the base substrate adjacent to and spaced apart from a first side of the light blocking member in the second direction, the first dummy patterns being disposed between the first pad wires and the second pad wires in the first direction, each of the first dummy patterns extending parallel to the first pad wires and the second pad wires, and
second dummy patterns disposed on the bottom surface of the base substrate adjacent to and spaced apart from a second side of the light blocking member in the second direction, the second dummy patterns being disposed between the first pad wires and the second pad wires in the first direction, each of the second dummy patterns extending parallel to the first pad wires and the second pad wires,
wherein the first and second pad wires are configured for receiving a power supply voltage from the first and second pad electrodes,
wherein the first and second dummy patterns are not configured for receiving the power supply voltage from the first and second pad electrodes, wherein the first and second pad wires and the first and second dummy patterns are composed of a similar material as each other.

6. The display device of claim 5, wherein the first film package does not include a driver IC chip.

7. The display device of claim 5, wherein:
the first pad electrodes are configured to receive the power supply voltage, the power supply voltage is generated by an external device through the first film package; and
the first pad electrodes are configured to provide the power supply voltage to the display structure.

8. The display device of claim 7, wherein power supply voltage includes:
a low power supply voltage having a first power level; and
a high power supply voltage having a second power level that is higher than the first power level.

9. The display device of claim 8, further comprising first semiconductor elements disposed between the substrate and the display structure, the first semiconductor elements are configured to be electrically connected to the display structures.

10. The display device of claim 9, wherein the high power supply voltage is provided in the second direction from the first pad area to the second pad area, and is sequentially provided in the second direction to the first semiconductor elements disposed in the display area.

11. The display device of claim 5, further comprising:
a second film package that is configured to be electrically connected to the second pad electrode, the second film package including:
a second base substrate;
pad wires disposed on a bottom surface of the second base substrate; and
a driver IC chip that is configured to be electrically connected to the pad wires.

12. The display device of claim 11, further comprising second semiconductor elements disposed between the substrate and the display structure,
wherein the second semiconductor elements are configured to be electrically connected to the display structures.

13. The display device of claim 12, wherein:
the second pad electrodes are configured to receive a driving signal generated by an external device; and
the second pad electrodes are configured to provide the driving signal to the second semiconductor element.

14. The display device of claim 13, wherein the driving signal includes a data signal.

15. The display device of claim 12, wherein the driving signal is provided in the second direction from the second pad area to the first pad area, and sequentially provided in the second direction to the second semiconductor elements disposed in the display area.

16. The display device of claim 5, wherein the light blocking member is spaced apart from the first pad wires and the second pad wires.

17. The display device of claim 5, further comprising:
third pad wires disposed between the light blocking member and the first pad wires, the third pad wires having a first bent part disposed along a profile of an outer periphery of the light blocking member at a portion where the light blocking member is located; and
fourth pad wires disposed between the light blocking member and the second pad wires, the fourth pad wires having a second bent part disposed along a profile of an outer periphery of the light blocking member at a portion where the light blocking member is located.

18. The display device of claim 5, wherein:
the first film package is configured to block external light from being transmitted through a partial portion of the first base substrate in which the first and second pad wires and the light blocking member are disposed; and
the first film package is configured to transmit external light through a portion of the first base substrate in which the first and second pad wires and the light blocking member are not disposed.

* * * * *